US012389732B2

(12) United States Patent
Kikuchi et al.

(10) Patent No.: US 12,389,732 B2
(45) Date of Patent: Aug. 12, 2025

(54) DISPLAY DEVICE AND SURFACE MOUNT DEVICE

(71) Applicant: SONY SEMICONDUCTOR SOLUTIONS CORPORATION, Kanagawa (JP)

(72) Inventors: Norifumi Kikuchi, Kanagawa (JP); Hisao Sakurai, Saitama (JP); Ippei Nishinaka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 390 days.

(21) Appl. No.: 17/997,046

(22) PCT Filed: Apr. 27, 2021

(86) PCT No.: PCT/JP2021/016806
§ 371 (c)(1),
(2) Date: Oct. 25, 2022

(87) PCT Pub. No.: WO2021/221056
PCT Pub. Date: Nov. 4, 2021

(65) Prior Publication Data
US 2023/0170454 A1    Jun. 1, 2023

(30) Foreign Application Priority Data

May 1, 2020    (JP) .................................. 2020-081365

(51) Int. Cl.
H10H 20/857    (2025.01)
H01L 25/075    (2006.01)
(52) U.S. Cl.
CPC ....... *H10H 20/857* (2025.01); *H01L 25/0753* (2013.01)

(58) Field of Classification Search
CPC ............. H10H 20/857; H10H 20/8513; H10H 20/8506; H10H 20/851; H10H 29/142;
(Continued)

(56) References Cited

U.S. PATENT DOCUMENTS

| | | | | |
|---|---|---|---|---|
| 2012/0175650 | A1* | 7/2012 | Tomiyoshi | G02F 1/133603 257/89 |
| 2012/0256814 | A1* | 10/2012 | Ootorii | G09G 3/3208 345/82 |
| 2014/0035798 | A1* | 2/2014 | Kawada | G09G 3/3233 345/77 |

(Continued)

FOREIGN PATENT DOCUMENTS

| | | |
|---|---|---|
| CN | 202404841 | 8/2012 |
| CN | 103545304 | 1/2014 |

(Continued)

OTHER PUBLICATIONS

International Search Report and Written Opinion prepared by the Japan Patent Office on Jun. 17, 2021, for International Application No. PCT/JP2021/016806, 3 pgs.

*Primary Examiner* — Victor A Mandala
(74) *Attorney, Agent, or Firm* — SHERIDAN ROSS P.C.

(57) ABSTRACT

A display device is provided with a substrate, a plurality of surface mount devices two-dimensionally arranged on the substrate in a first direction and a second direction, and a plurality of signal lines and a plurality of scanning lines arranged on the substrate. The surface mount device is provided with four pixels. Each of the four pixels is provided with light sources of three colors, and each of the light sources of three colors includes a light emitting diode element. The plurality of scanning lines extends in the first direction, and the plurality of signal lines extends in the second direction. The number of signal lines is three for two pixels arranged in the first direction, and the number of scanning lines is four for two pixels arranged in the second direction.

20 Claims, 19 Drawing Sheets

(58) Field of Classification Search
CPC .................. H01L 25/0753; G09G 3/32; G09G 2300/0426; G09G 2300/0452; G09G 3/14; G09F 9/302; G09F 9/33
See application file for complete search history.

(56) References Cited

U.S. PATENT DOCUMENTS

| | | | | |
|---|---|---|---|---|
| 2014/0111557 | A1* | 4/2014 | Omata | G09G 3/3233 |
| | | | | 345/76 |
| 2014/0168037 | A1 | 6/2014 | Sakariya | |
| 2016/0365031 | A1* | 12/2016 | Wu | G09G 3/3275 |
| 2017/0213502 | A1 | 7/2017 | Henry et al. | |
| 2019/0393389 | A1* | 12/2019 | Chen | H10H 20/8514 |
| 2020/0051964 | A1 | 2/2020 | Jung et al. | |
| 2023/0124835 | A1* | 4/2023 | Kikuchi | H10K 59/351 |
| | | | | 345/694 |
| 2023/0420441 | A1* | 12/2023 | Kikuchi | H01L 23/5386 |

FOREIGN PATENT DOCUMENTS

| | | |
|---|---|---|
| CN | 103996676 | 8/2014 |
| CN | 107078132 | 8/2017 |
| CN | 110828510 | 2/2020 |
| EP | 3175482 | 6/2017 |
| EP | 3608964 | 2/2020 |
| JP | 2001-075508 | 3/2001 |
| JP | 2001-127344 | 5/2001 |
| JP | 2017-529557 | 10/2017 |
| JP | 2019140361 A | 8/2019 |
| KR | 2017-0037975 | 4/2017 |
| KR | 20190143323 A | 12/2019 |
| KR | 2020-0017336 | 2/2020 |
| WO | WO 2016/016460 | 2/2016 |
| WO | WO 2019/049360 | 3/2019 |

\* cited by examiner

DISPLAY DEVICE AND SURFACE MOUNT DEVICE

CROSS REFERENCE TO RELATED APPLICATIONS

This application is a national stage application under 35 U.S.C. 371 and claims the benefit of PCT Application No. PCT/JP2021/016806, having an international filing date of 27 Apr. 2021, which designated the United States, which PCT application claimed the benefit of Japanese Patent Application No. 2020-081365, filed 1 May 2020, the entire disclosures of each of which are incorporated herein by reference.

TECHNICAL FIELD

The present disclosure relates to a display device and a surface mount device.

BACKGROUND ART

In recent years, a display device in which a plurality of surface mount devices (hereinafter appropriately referred to as "SMD") is two-dimensionally arranged has been proposed (refer to, for example, Patent Document 1 and Patent Document 2). The SMD is provided with pixels including light emitting diode elements (hereinafter, appropriately referred to as "LED elements") of three colors or two colors.

CITATION LIST

Patent Document

Patent Document 1: Japanese Patent Application Laid-Open No. 2001-75508
Patent Document 2: Japanese Patent Application Laid-Open No. 2001-127344

SUMMARY OF THE INVENTION

Problems to be Solved by the Invention

However, in the LED display device described above, since the number of signal lines connected to the SMD is large, there is a problem that line-and-space (hereinafter, appropriately referred to as "L/S") of the signal lines is narrow.

An object of the present disclosure is to provide a display device and a surface mount device capable of suppressing L/S of signal lines from narrowing.

Solutions to Problems

In order to solve the above-described problem, a first disclosure is
a display device provided with:
a substrate;
a plurality of surface mount devices two-dimensionally arranged on the substrate in a first direction and a second direction; and
a plurality of signal lines and a plurality of scanning lines arranged on the substrate, in which
a surface mount device is provided with four pixels,
each of the four pixels is provided with light sources of three colors, and each of the light sources of three colors includes a light emitting diode element,
the plurality of scanning lines extends in the first direction,
the plurality of signal lines extends in the second direction,
the number of signal lines is three for two pixels arranged in the first direction, and
the number of scanning lines is four for two pixels arranged in the second direction.
A second disclosure is
a display device provided with:
a substrate;
a plurality of surface mount devices two-dimensionally arranged on the substrate in a first direction and a second direction; and
a plurality of signal lines and a plurality of scanning lines arranged on the substrate, in which
a surface mount device is provided with four pixels,
each of the four pixels is provided with light sources of two colors, and each of the light sources of two colors includes a light emitting diode element,
a plurality of scanning lines extends in the first direction,
a plurality of signal lines extends in the second direction,
the number of signal lines is three for two pixels arranged in the second direction, and
the number of scanning lines is three or four for two pixels arranged in the first direction.
A third disclosure is
a surface mount device used in a display device, the surface mount device provided with:
four pixels;
a first terminal, a second terminal, and a third terminal connected to different signal lines, respectively; and
a fourth terminal, a fifth terminal, a sixth terminal, and a seventh terminal connected to different scanning lines, respectively, in which
each of the four pixels is provided with light sources of three colors, and each of the light sources of three colors includes a light emitting diode element.
A fourth disclosure is
a surface mount device used in a display device, the surface mount device provided with:
four pixels;
a first terminal, a second terminal, and a third terminal connected to different signal lines, respectively; and
a fourth terminal, a fifth terminal, a sixth terminal, and a seventh terminal connected to different scanning lines, respectively, in which
each of the four pixels is provided with light sources of two colors, and each of the light sources of two colors includes a light emitting diode element.
A fifth disclosure is
a surface mount device used in a display device, the surface mount device provided with:
four pixels;
a first terminal, a second terminal, and a third terminal connected to different signal lines, respectively; and
a fourth terminal, a fifth terminal, and a sixth terminal connected to different scanning lines, respectively, in which
each of the four pixels is provided with light sources of two colors, and each of the light sources of two colors includes a light emitting diode element.

MODE FOR CARRYING OUT THE INVENTION

Embodiments of the present disclosure are described in the following order. Note that, the same or corresponding portions are assigned with the same reference sign throughout all the drawings of the following embodiments.

1 First Embodiment (example of display device in which light sources of three colors form pixels)
2 Second Embodiment (example of display device in which light sources of two colors form pixels)
3 Variation 1 First Embodiment

[Configuration of Display Device]

Figure 1:
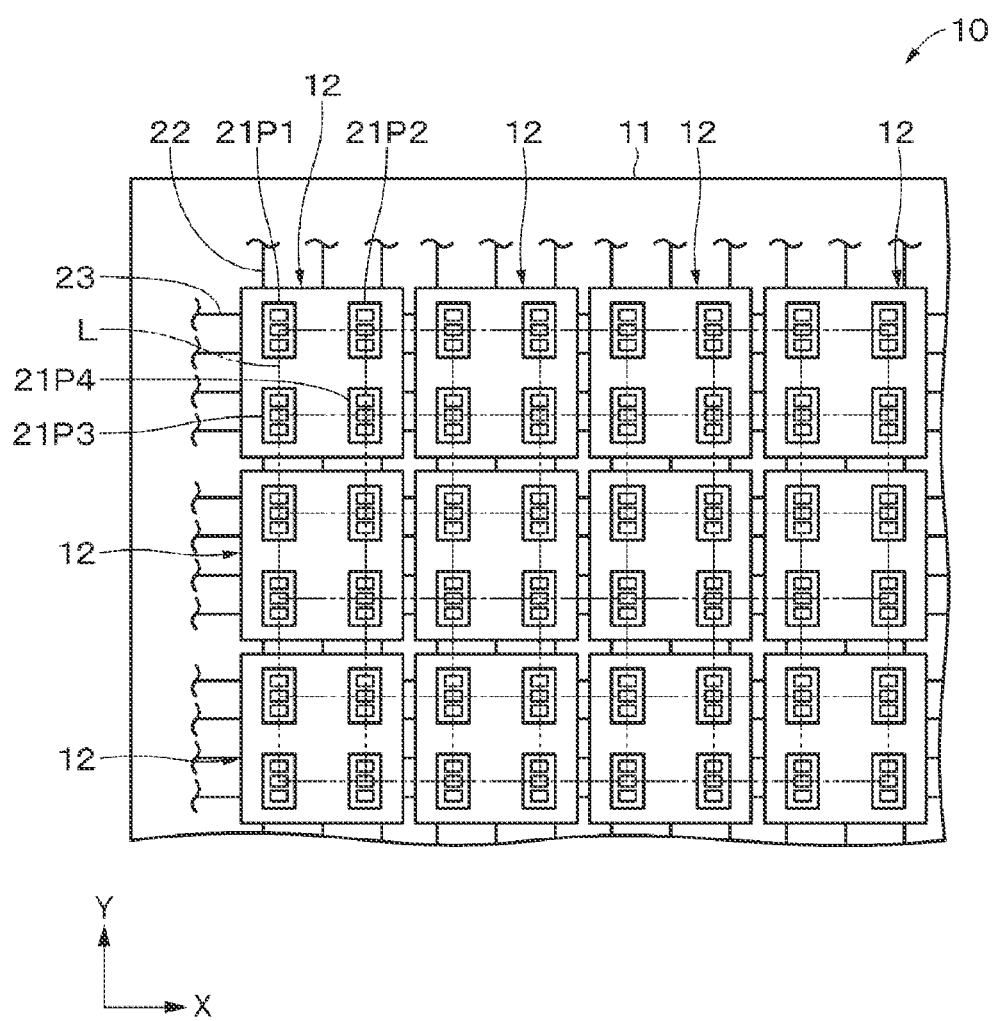
FIG. 1 is a plane view illustrating an example of a configuration of a display device according to a first embodiment of the present disclosure.

FIG. 1 is a plane view illustrating an example of a configuration of a display device 10 according to a first embodiment of the present disclosure. The display device 10 is a so-called LED display device, and is provided with a substrate 11, a plurality of SMDs 12 arranged on the substrate 11, and a plurality of signal lines 22 and a plurality of scanning lines 23 arranged on the substrate 11. The display device 10 may further be provided with a driver integrated circuit (IC) arranged on the substrate 11. The display device 10 may be a fine-pitch display having a pixel pitch of 1 mm or shorter.

(Substrate)

The substrate 11 is, for example, a printed circuit board (PCB). A principal surface of the substrate 11 may have a planar shape or may have a curved shape. The substrate 11 may be a flexible substrate. In this specification, a first direction and a second direction orthogonal to each other in a plane of the substrate 11 are referred to as an X-axis direction and a Y-axis direction, respectively.

(Signal Line, Scanning Line)

The plurality of scanning lines 23 extends in the X-axis direction (first direction). The plurality of signal lines 22 extends in the Y-axis direction (second direction).

(Driver IC)

The driver IC controls image display of the display device 10 by controlling the plurality of SMDs 12 via the plurality of scanning lines 23 and the plurality of signal lines 22.

(SMD)

The plurality of SMDs 12 is two-dimensionally arranged on the substrate 11 in the X-axis direction (first direction) and the Y-axis direction (second direction). The two-dimensional arrangement is lattice-shaped arrangement.

Figure 2A:
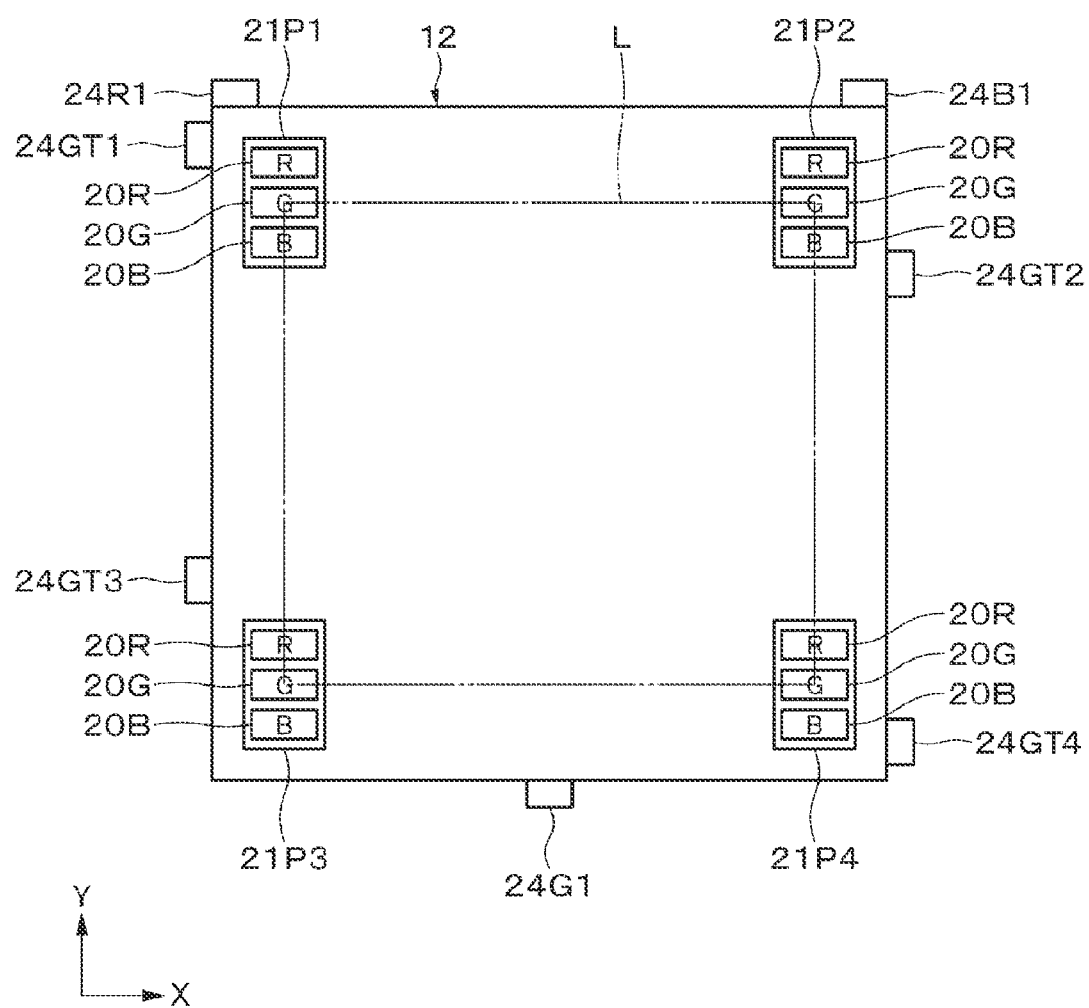
FIG. 2A is a plane view illustrating an example of a configuration of an SMD provided on the display device according to the first embodiment of the present disclosure.
Figure 2B:
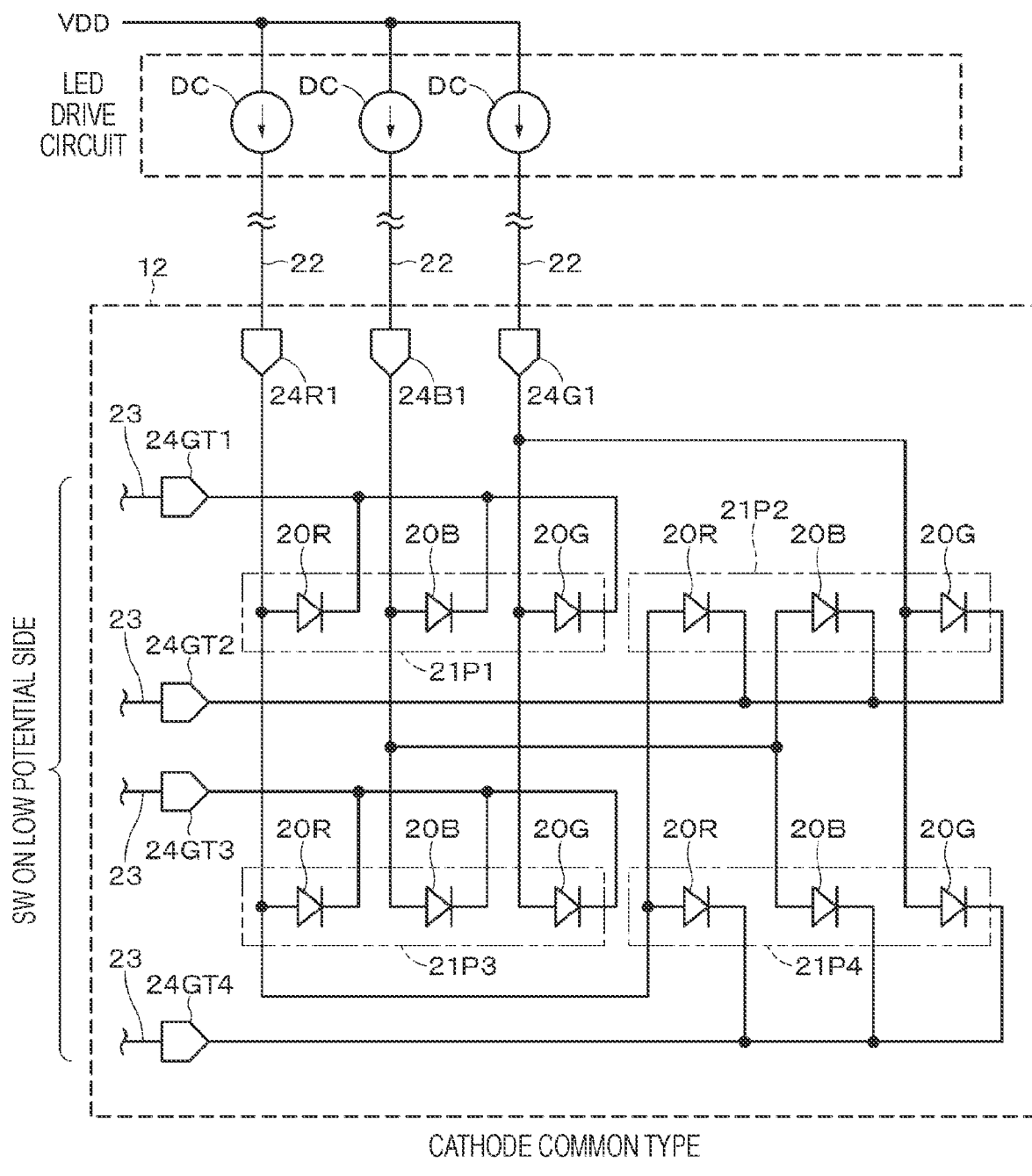
FIG. 2B is a circuit diagram illustrating an example of a circuit of the SMD provided on the display device according to the first embodiment of the present disclosure.

FIG. 2A is a plane view illustrating an example of a configuration of the SMD 12. FIG. 2B is a circuit diagram illustrating an example of a circuit of the SMD 12. The SMD 12 is an SMD (4in1 SMD) obtained by integrating four pixels into one chip, and is provided with a first pixel 21P1, a second pixel 21P2, a third pixel 21P3, and a fourth pixel 21P4. In the following description, the first pixel 21P1, the second pixel 21P2, the third pixel 21P3, and the fourth pixel 21P4 are sometimes referred to as a pixel 21P in a case where they are not especially distinguished.

A plurality of pixels 21P is two-dimensionally arranged on the substrate 11 in the X-axis direction and the Y-axis direction. The two-dimensional arrangement is lattice-shaped arrangement. Although FIGS. 1 and 2A illustrate an example in which a basic lattice L in the lattice-shaped arrangement is a square, the shape of the basic lattice L is not limited thereto, and may be a quadrangle such as a rectangle, a rhombus, or a parallelogram. The SMD 12 includes one basic lattice L.

In one basic lattice L, the first pixel 21P1 and the fourth pixel 21P4 are diagonally arranged, and the second pixel 21P2 and the third pixel 21P3 are diagonally arranged. An nth (n is an odd number not smaller than 1) pixel column in the X-axis direction is formed by alternately arranging the first pixel 21P1 and the third pixel 21P3 in the Y-axis direction. An mth (m is an even number not smaller than 2) pixel column in the X-axis direction is formed by alternately arranging the second pixel 21P2 and the fourth pixel 21P4 in the Y-axis direction.

Each pixel 21P is provided with light sources of three colors. Specifically, each pixel 21P is provided with a red LED element 20R, a green LED element 20G, and a blue LED element 20B. The red LED element 20R is an example of a red light source configured to be able to emit red light. The green LED element 20G is an example of a green light source configured to be able to emit green light. The blue LED element 20B is an example of a blue light source configured to be able to emit blue light. The red light source is an example of a first color light source configured to be able to emit first color light. The green light source is an example of a second color light source configured to be able to emit second color light. The blue light source is an example of a third color light source configured to be able to emit third color light.

In the first embodiment, an anode provided on each of the red LED element 20R, the green LED element 20G, and the blue LED element 20B is an example of a first electrode, and a cathode provided on each of the red LED element 20R, the green LED element 20G, and the blue LED element 20B is an example of a second electrode.

The SMD 12 is of a cathode common type in which the cathode is a common terminal. The SMD 12 is provided with an anode terminal 24R1, an anode terminal 24G1, an anode terminal 24B1, a cathode terminal (gate terminal) 24GT1, a cathode terminal (gate terminal) 24GT2, a cathode terminal (gate terminal) 24GT3, and a cathode terminal (gate terminal) 24GT4. The cathode terminal 24GT1, the cathode terminal 24GT2, the cathode terminal 24GT3, and the cathode terminal 24GT4 are the common terminals.

In the first embodiment, the anode terminal 24R1, the anode terminal 24G1, and the anode terminal 24B1 are examples of a first terminal, a second terminal, and a third terminal, respectively. The cathode terminal 24GT1, the cathode terminal 24GT2, the cathode terminal 24GT3, and the cathode terminal 24GT4 are examples of a fourth terminal, a fifth terminal, a sixth terminal, and a seventh terminal, respectively.

The anodes (first electrodes) of the red LED elements 20R included in the first pixel 21P1, the second pixel 21P2, the third pixel 21P3, and the fourth pixel 21P4 are connected to the anode terminal 24R1. The cathodes (second electrodes) of the red LED elements 20R included in the first pixel 21P1, the second pixel 21P2, the third pixel 21P3, and the fourth pixel 21P4 are connected to the cathode terminal 24GT1, the cathode terminal 24GT2, the cathode terminal 24GT3, and the cathode terminal 24GT4, respectively.

The anodes (first electrodes) of the green LED elements 20G included in the first pixel 21P1, the second pixel 21P2, the third pixel 21P3, and the fourth pixel 21P4 are connected to the anode terminal 24G1. The cathodes (second electrodes) of the green LED elements 20G included in the first pixel 21P1, the second pixel 21P2, the third pixel 21P3, and the fourth pixel 21P4 are connected to the cathode terminal 24GT1, the cathode terminal 24GT2, the cathode terminal 24GT3, and the cathode terminal 24GT4, respectively.

The anodes (first electrodes) of the blue LED elements 20B included in the first pixel 21P1, the second pixel 21P2, the third pixel 21P3, and the fourth pixel 21P4 are connected to the anode terminal 24B1. The cathodes (second electrodes) of the blue LED elements 20B included in the first pixel 21P1, the second pixel 21P2, the third pixel 21P3, and the fourth pixel 21P4 are connected to the cathode terminal 24GT1, the cathode terminal 24GT2, the cathode terminal 24GT3, and the cathode terminal 24GT4, respectively.

The anode terminal 24R1, the anode terminal 24G1, and the anode terminal 24B1 are connected to different signal lines 22, respectively. One end of the signal line 22 is connected to a direct current source DC. The cathode terminal 24GT1, the cathode terminal 24GT2, the cathode terminal 24GT3, and the cathode terminal 24GT4 are connected to different scanning lines 23, respectively. One end of the scanning line 23 is connected to a gate (not illustrated) as a switch. In the cathode common type SMD 12, a current is applied from a driver into each of the LED elements 20R, 20G, and 20B.

Figure 2C:
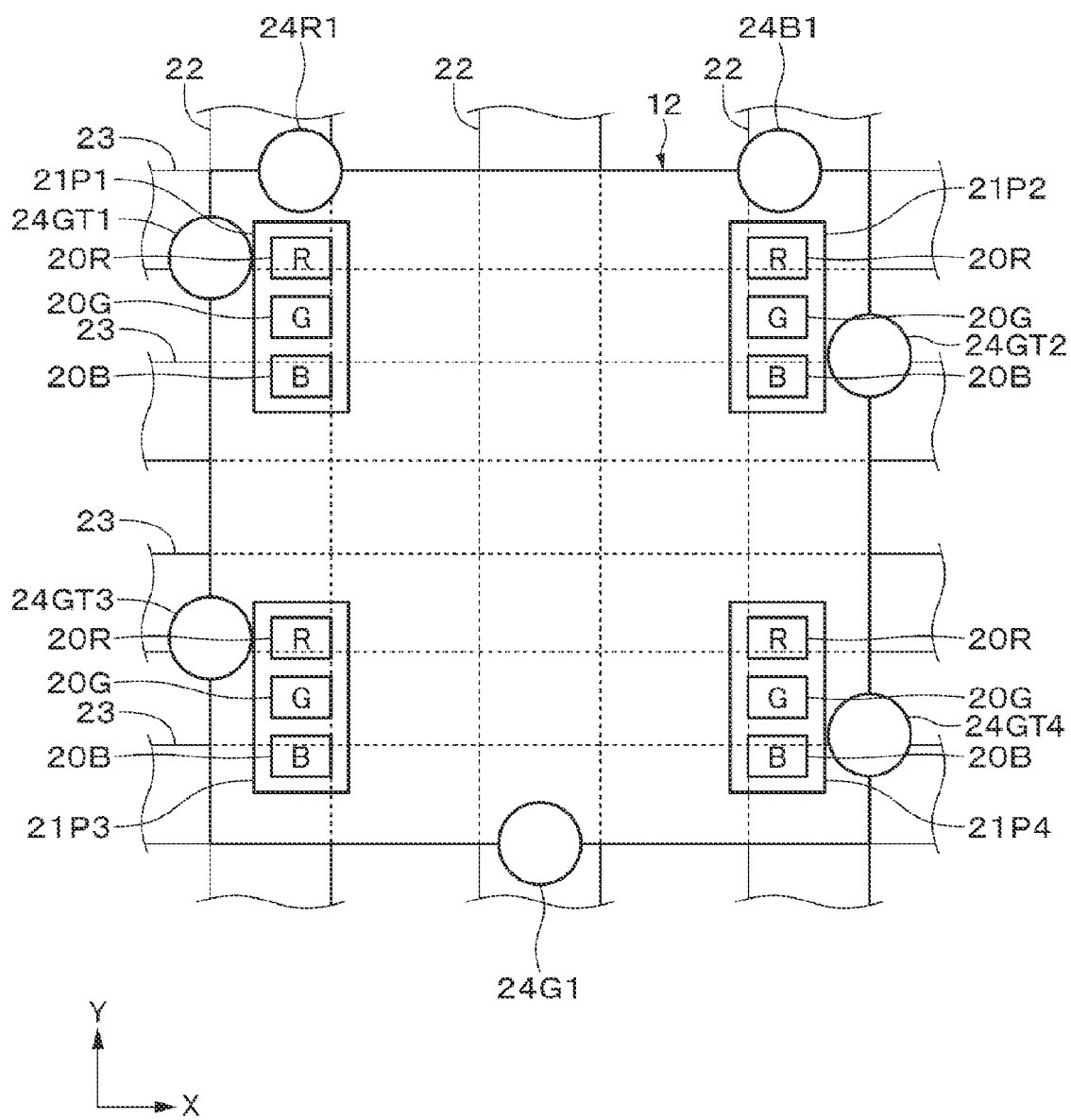
FIG. 2C is a schematic diagram illustrating an example of arrangement of signal lines and scanning lines of the display device according to the first embodiment of the present disclosure.

FIG. 2C is a schematic diagram illustrating an example of arrangement of the signal lines 22 and the scanning lines 23 of the display device 10. The number of signal lines 22 is three for one SMD 12. More specifically, the number is three for two pixels 21P arranged in the X-axis direction in one SMD 12. The three signal lines 22 are connected to the anode terminal 24R1, the anode terminal 24G1, and the anode terminal 24B1, respectively.

The number of scanning lines 23 is four for one SMD 12. More specifically, the number is four for two pixels 21P arranged in the Y-axis direction in one SMD 12. The four scanning lines 23 are made the cathode terminal 24GT1, the cathode terminal 24GT2, the cathode terminal 24GT3, and the cathode terminal 24GT4, respectively.

[Action and Effect]

Hereinafter, action and effect are described while comparing a display device according to Comparative Example 1 with the display device 10 according to the first embodiment.

Figure 3A:
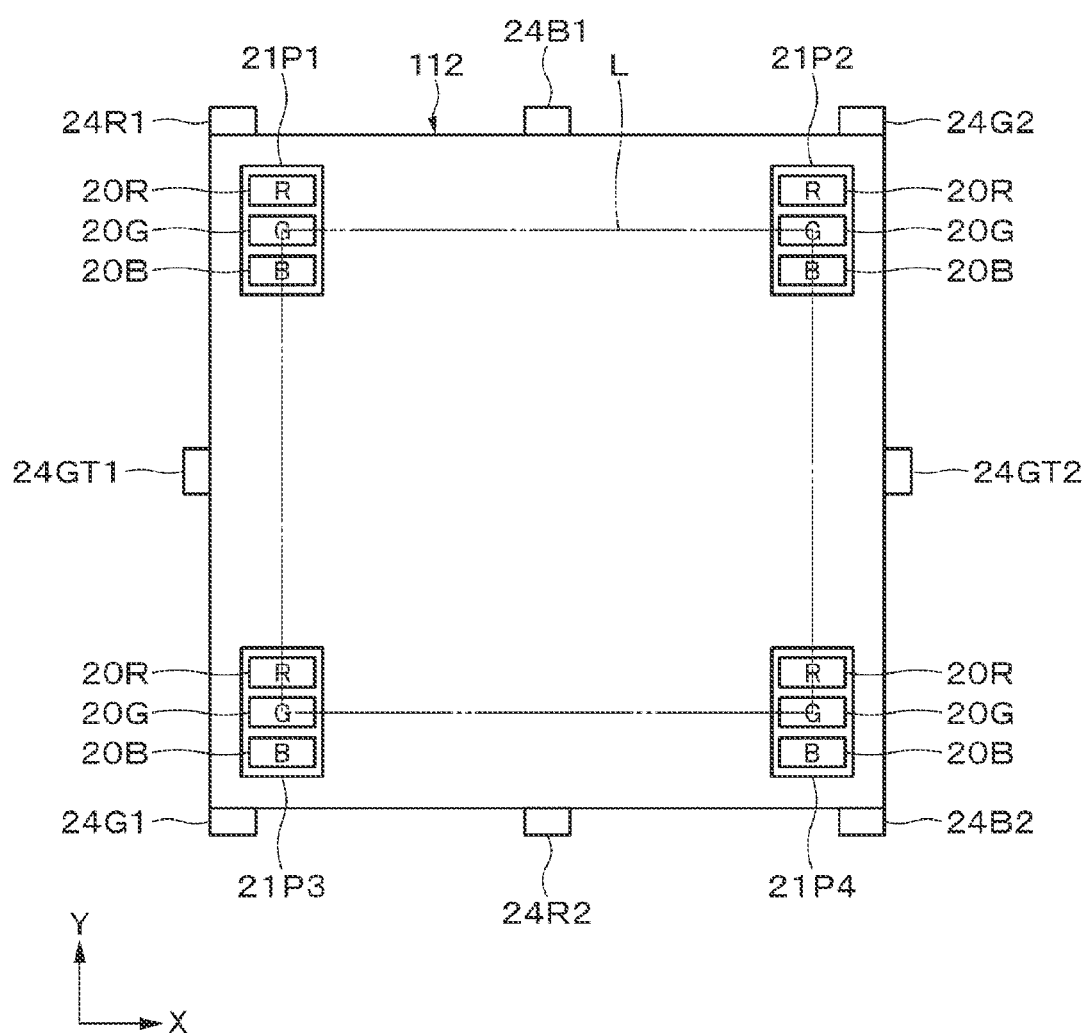
FIG. 3A is a plane view illustrating a configuration of an SMD provided on a display device according to Comparative Example 1.
Figure 3B:
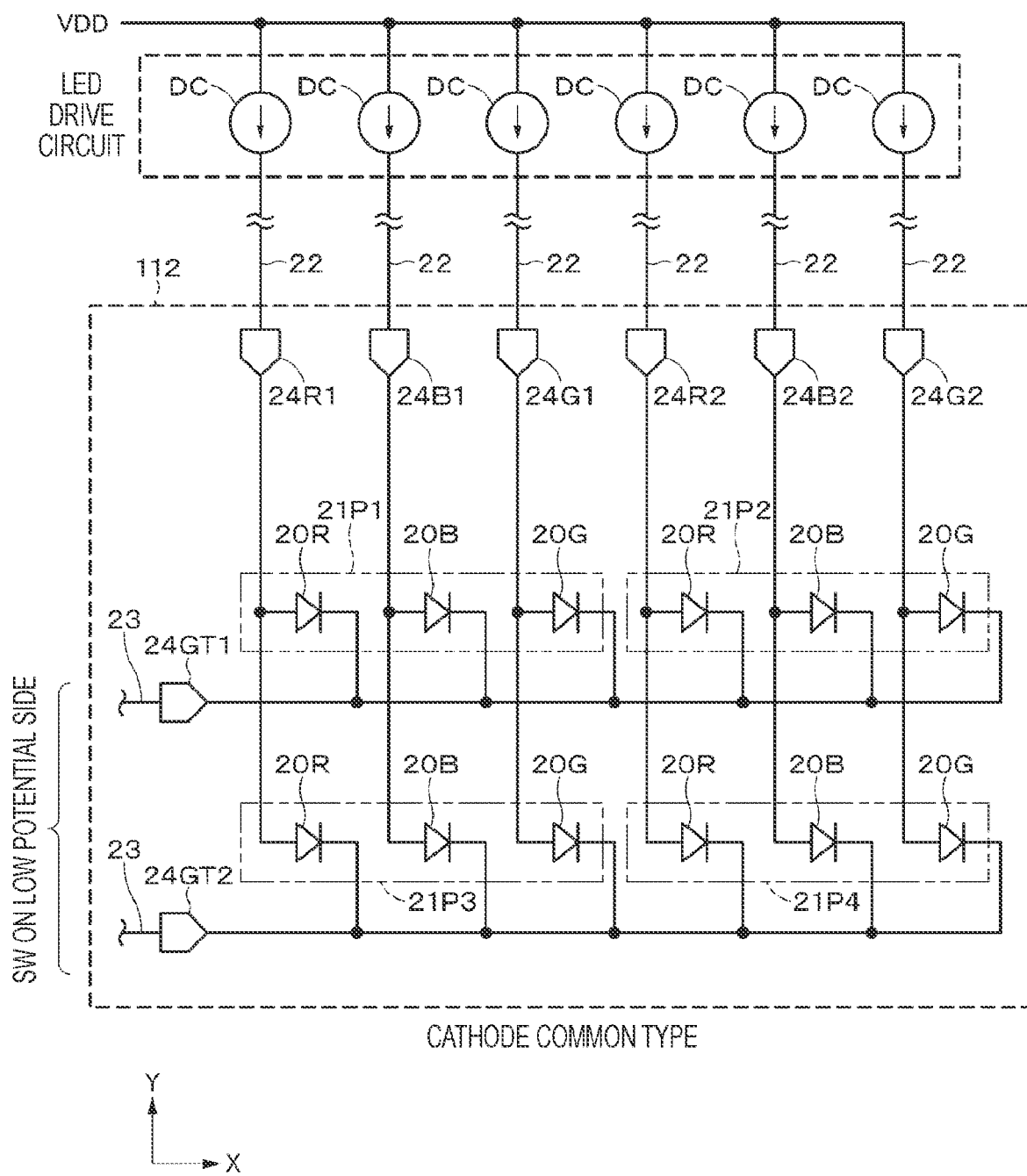
FIG. 3B is a circuit diagram illustrating a circuit of the SMD provided on the display device according to Comparative Example 1.
Figure 3C:
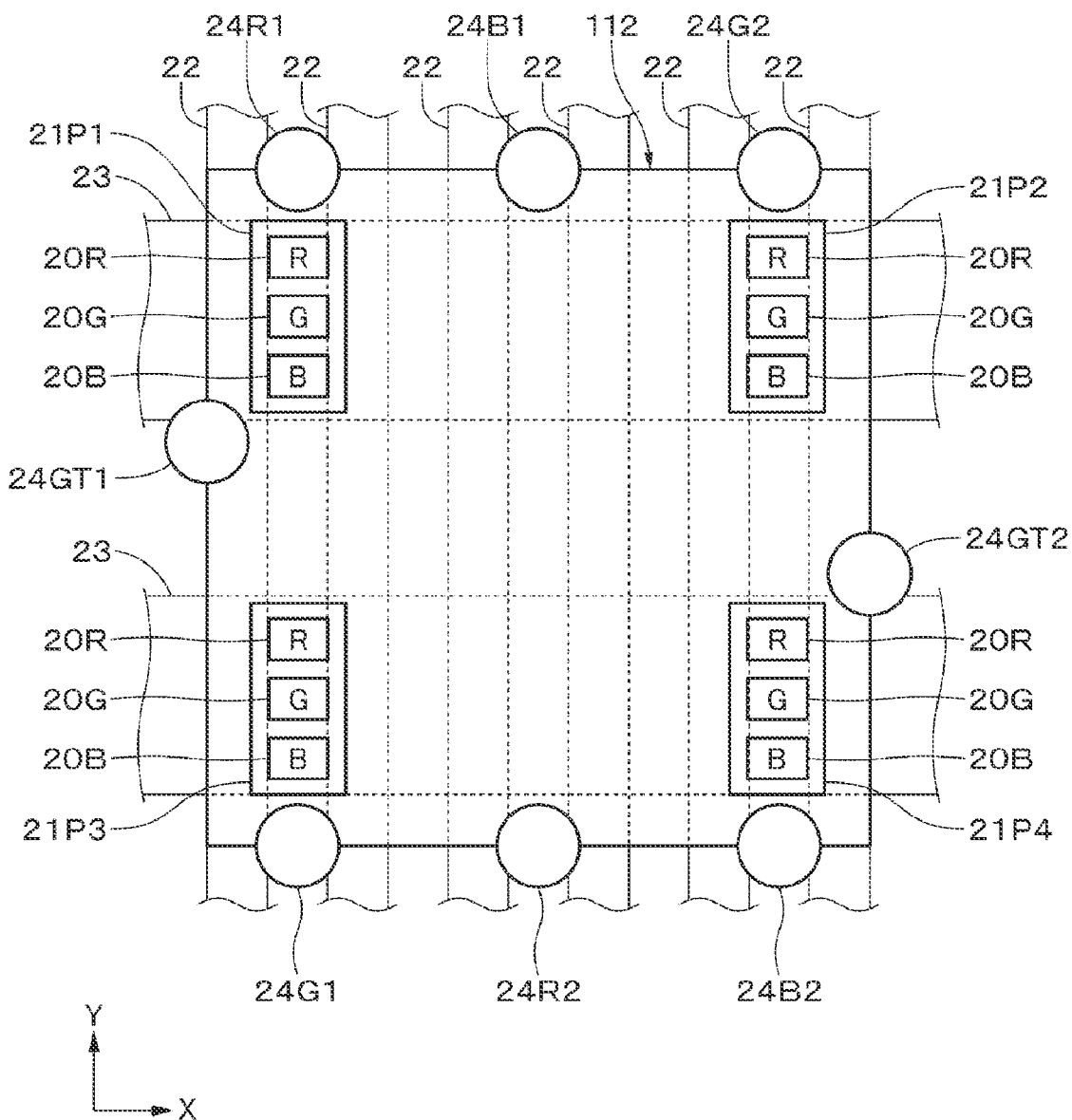
FIG. 3C is a schematic diagram illustrating arrangement of signal lines and scanning lines of the display device according to Comparative Example 1.

FIG. 3A is a plane view illustrating a configuration of an SMD 112 provided on the display device according to Comparative Example 1. FIG. 3B is a circuit diagram illustrating a circuit of the SMD 112 provided on the display device according to Comparative Example 1. FIG. 3C is a schematic diagram illustrating arrangement of signal lines 22 and scanning lines 23 of the display device according to Comparative Example 1.

The display device according to Comparative Example 1 is provided with a plurality of SMDs 112 having following configurations (A1), (B1), and (C1).

(A1) Both anodes of red LED elements 20R included in a first pixel 21P1 and a third pixel 21P3 are connected to an anode terminal 24R1, and cathodes of the red LED elements 20R included in the first pixel 21P1 and the third pixel 21P3 are connected to cathode terminals 24GT1 and 24GT2, respectively. Both the anodes of the red LED elements 20R included in a second pixel 21P2 and a fourth pixel 21P4 are connected to an anode terminal 24R2, and the cathodes of the red LED elements 20R included in the second pixel 21P2 and the fourth pixel 21P4 are connected to the cathode terminals 24GT1 and 24GT2, respectively.

(B1) Both anodes of green LED elements 20G included in the first pixel 21P1 and the third pixel 21P3 are connected to an anode terminal 24G1, and cathodes of the green LED elements 20G included in the first pixel 21P1 and the third pixel 21P3 are connected to the cathode terminals 24GT1 and 24GT2, respectively. Both the anodes of the green LED elements 20G included in the second pixel 21P2 and the fourth pixel 21P4 are connected to an anode terminal 24G2, and the cathodes of the green LED elements 20G included in the second pixel 21P2 and the fourth pixel 21P4 are connected to the cathode terminals 24GT1 and 24GT2, respectively.

(C1) Both anodes of blue LED elements 20B included in the first pixel 21P1 and the third pixel 21P3 are connected to an anode terminal 24B1, and cathodes of the blue LED elements 20B included in the first pixel 21P1 and the third pixel 21P3 are connected to the cathode terminals 24GT1 and 24GT2, respectively. Both the anodes of the blue LED elements 20B included in the second pixel 21P2 and the fourth pixel 21P4 are connected to an anode terminal 24B2, and the cathodes of the blue LED elements 20B included in the second pixel 21P2 and the fourth pixel 21P4 are connected to the cathode terminals 24GT1 and 24GT2, respectively.

Since the display device according to Comparative Example 1 is provided with the plurality of SMDs 12A having the above-described configurations (A1), (B1), and (C1), the number of scanning lines 23 is two for one SMD 12A, but the number of signal lines 22 is six for one SMD 12A. Therefore, the number of signal lines 22 is large, and it is difficult to provide a margin to L/S of the signal lines 22.

The display device 10 according to the first embodiment is provided with the plurality of SMDs 12 having the following configurations (A2), (B2), and (C2).

(A2) All the anodes of the red LED elements 20R included in the first pixel 21P1, the second pixel 21P2, the third pixel 21P3, and the fourth pixel 21P4 are connected to the anode terminal 24R1. The cathodes of the red LED elements 20R included in the first pixel 21P1, the second pixel 21P2, the third pixel 21P3, and the fourth pixel 21P4 are connected to the cathode terminals 24GT1, 24GT2, 24GT3, and 24GT4, respectively.

(B2) All the anodes of the green LED elements 20G included in the first pixel 21P1, the second pixel 21P2, the third pixel 21P3, and the fourth pixel 21P4 are connected to the anode terminal 24G1. The cathodes of the green LED elements 20G included in the first pixel 21P1, the second pixel 21P2, the third pixel 21P3, and the fourth pixel 21P4 are connected to the cathode terminals 24GT1, 24GT2, 24GT3, and 24GT4, respectively.

(C2) All the anodes of the blue LED elements 20B included in the first pixel 21P1, the second pixel 21P2, the third pixel 21P3, and the fourth pixel 21P4 are connected to the anode terminal 24B1. The cathodes of the blue LED elements 20B included in the first pixel 21P1, the second pixel 21P2, the third pixel 21P3, and the fourth pixel 21P4 are connected to the cathode terminals 24GT1, 24GT2, 24GT3, and 24GT4, respectively.

Since the display device 10 according to the first embodiment is provided with the plurality of SMDs 12 having the above-described configurations (A2), (B2), and (C2), the number of signal lines 22 is three for one SMD 12. Therefore, since the number of scanning lines 23 may be halved with respect to the display device according to Comparative Example 1, it is possible to suppress the L/S of the signal lines 22 from being narrowed, to provide a margin to the L/S of the signal lines 22, and to reduce processes. Therefore, a cost of the substrate 11 such as the PCB may be reduced. Furthermore, by providing the margin to the L/S of the signal lines 22, it is possible to suppress deterioration in image quality (especially, deterioration in image quality of low gradation luminance of short-time light emission).

The configuration described above is especially effective in the fine-pitch display having the pixel pitch of 1 mm or shorter. This is because, in such fine-pitch display, the L/S of the signal lines has been especially narrow conventionally, and thus the effect obtained in a case where the configuration described above is applied is remarkable.

2 Second Embodiment

[Configuration of Display Device]

Figure 4A:
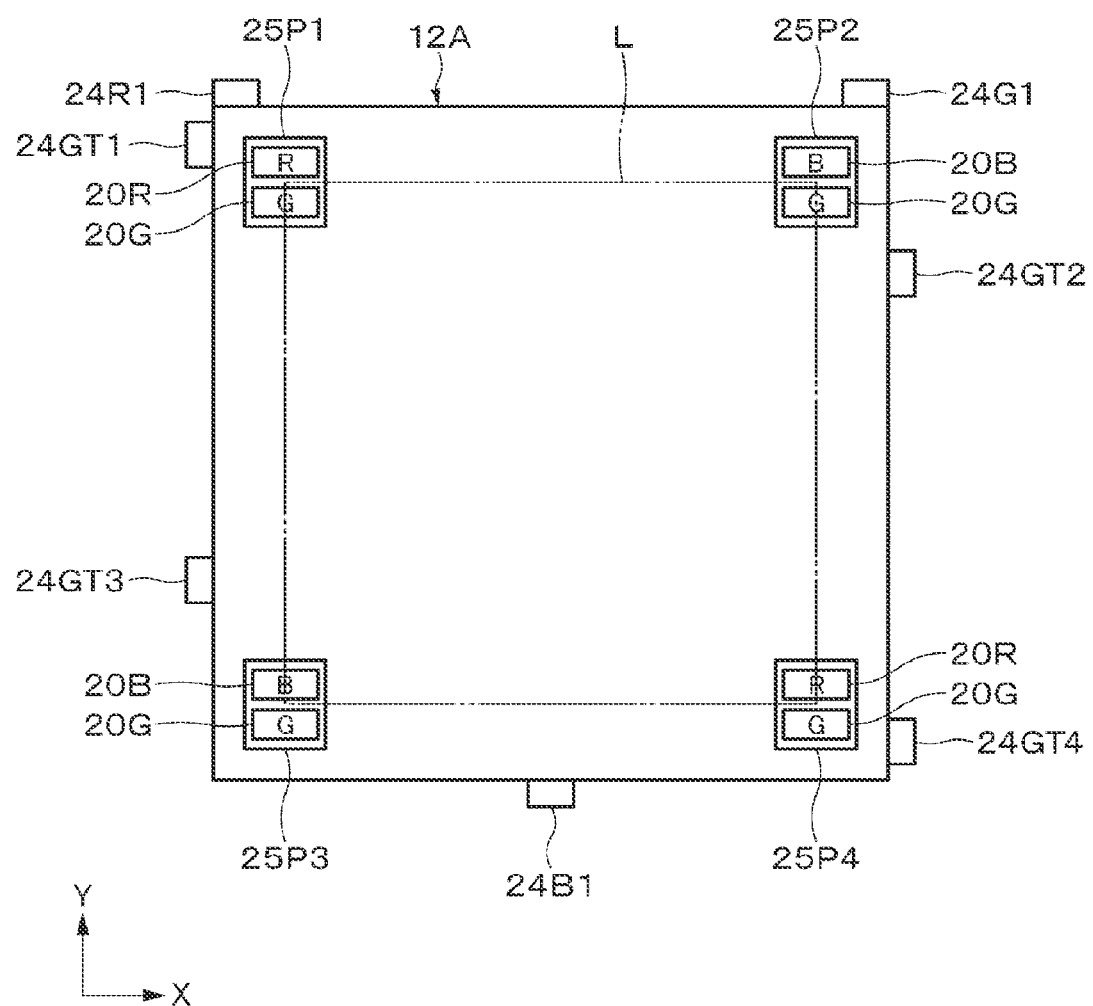
FIG. 4A is a plane view illustrating an example of a configuration of an SMD provided on a display device according to a second embodiment of the present disclosure.
Figure 4B:
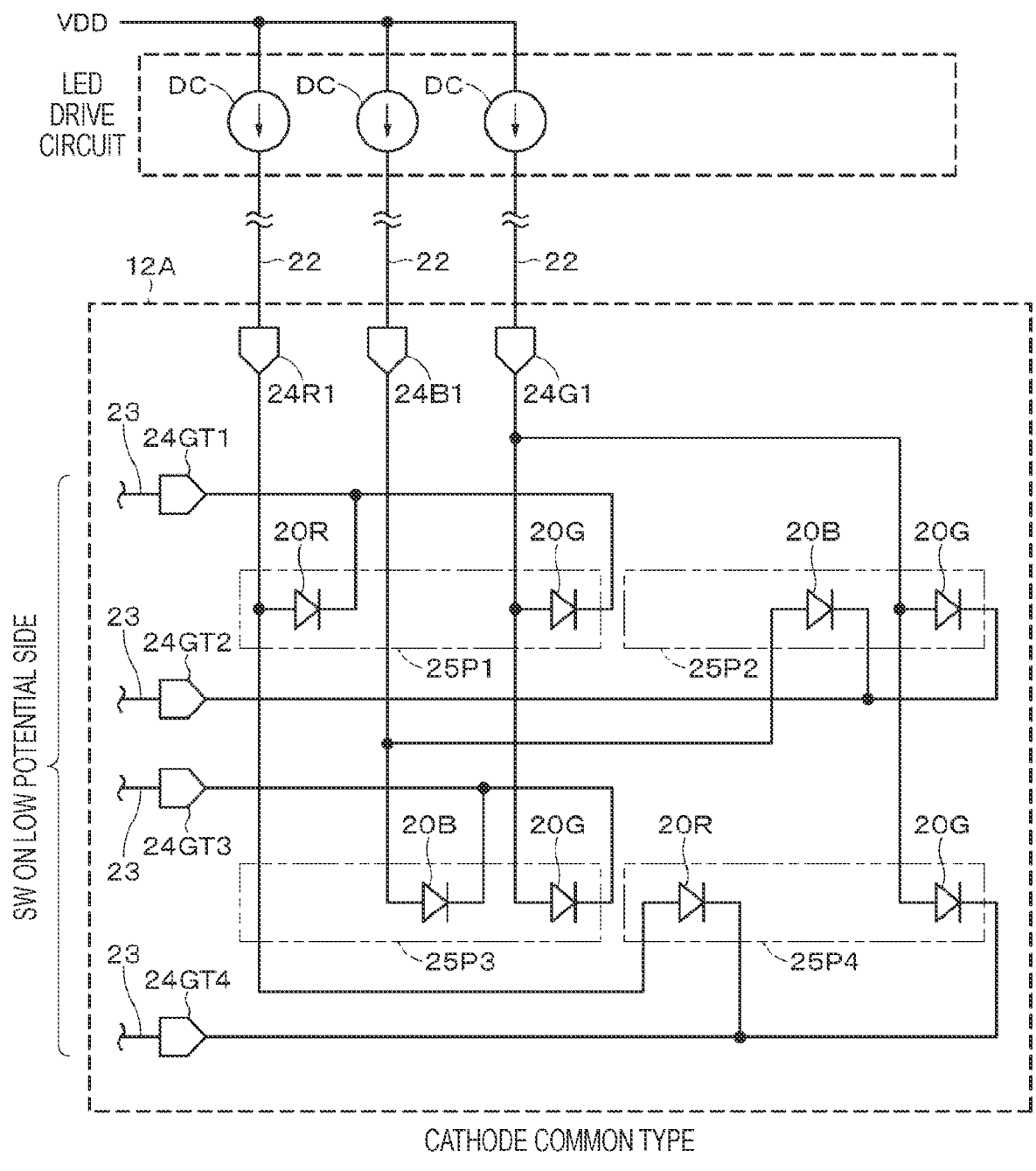
FIG. 4B is a circuit diagram illustrating an example of a circuit of the SMD provided on the display device according to the second embodiment of the present disclosure.

FIG. 4A is a plane view illustrating an example of a configuration of an SMD 12A provided on a display device according to a second embodiment. FIG. 4B is a circuit diagram illustrating an example of a circuit of the SMD 12A provided on the display device according to the second embodiment.

Each of a first pixel 25P1, a second pixel 25P2, a third pixel 25P3, and a fourth pixel 25P4 is provided with light sources of two colors. Specifically, each of the first pixel 25P1 and the fourth pixel 25P4 is provided with a red LED element 20R and a green LED element 20G. Each of the second pixel 25P2 and the third pixel 25P3 is provided with a blue LED element 20B and the green LED element 20G.

Since resolution recognition of blue is low (the number of M cone cells is small) in human eyes, even if the blue LED element 20B is thinned out from a first pixel 21P1 and a fourth pixel 21P4 (refer to FIG. 2A) provided with light sources of three colors of the red LED element 20R, the green LED element 20G, and the blue LED element 20B to form the first pixel 25P1 and the fourth pixel 25P4, an influence on a sense of resolution is small. Furthermore, since resolution recognition of red is lower in visibility than that of green, even if the red LED element 20R is thinned out from a second pixel 21P2 and a third pixel 21P3 (refer to FIG. 2A) provided with the light sources of three colors described above to form the second pixel 25P2 and the third pixel 25P3, an influence on the sense of resolution is small.

Anodes (first electrodes) of the red LED elements 20R included in the first pixel 25P1 and the fourth pixel 25P4 are connected to an anode terminal 24R1. Cathodes (second electrodes) of the red LED elements 20R included in the first pixel 25P1 and the fourth pixel 25P4 are connected to a cathode terminal 24GT1 and a cathode terminal 24GT4, respectively.

Anodes (first electrodes) of the blue LED elements 20B included in the second pixel 25P2 and the third pixel 25P3 are connected to an anode terminal 24B1. Cathodes (second electrodes) of the blue LED elements 20B included in the second pixel 25P2 and the third pixel 25P3 are connected to a cathode terminal 24GT2 and a cathode terminal 24GT3, respectively.

The display device according to the second embodiment is similar to the display device 10 according to the first embodiment except for the description above.

[Action and Effect]

Hereinafter, action and effect are described while comparing a display device according to Comparative Example 2 with a display device 10 according to the second embodiment.

Figure 5A:
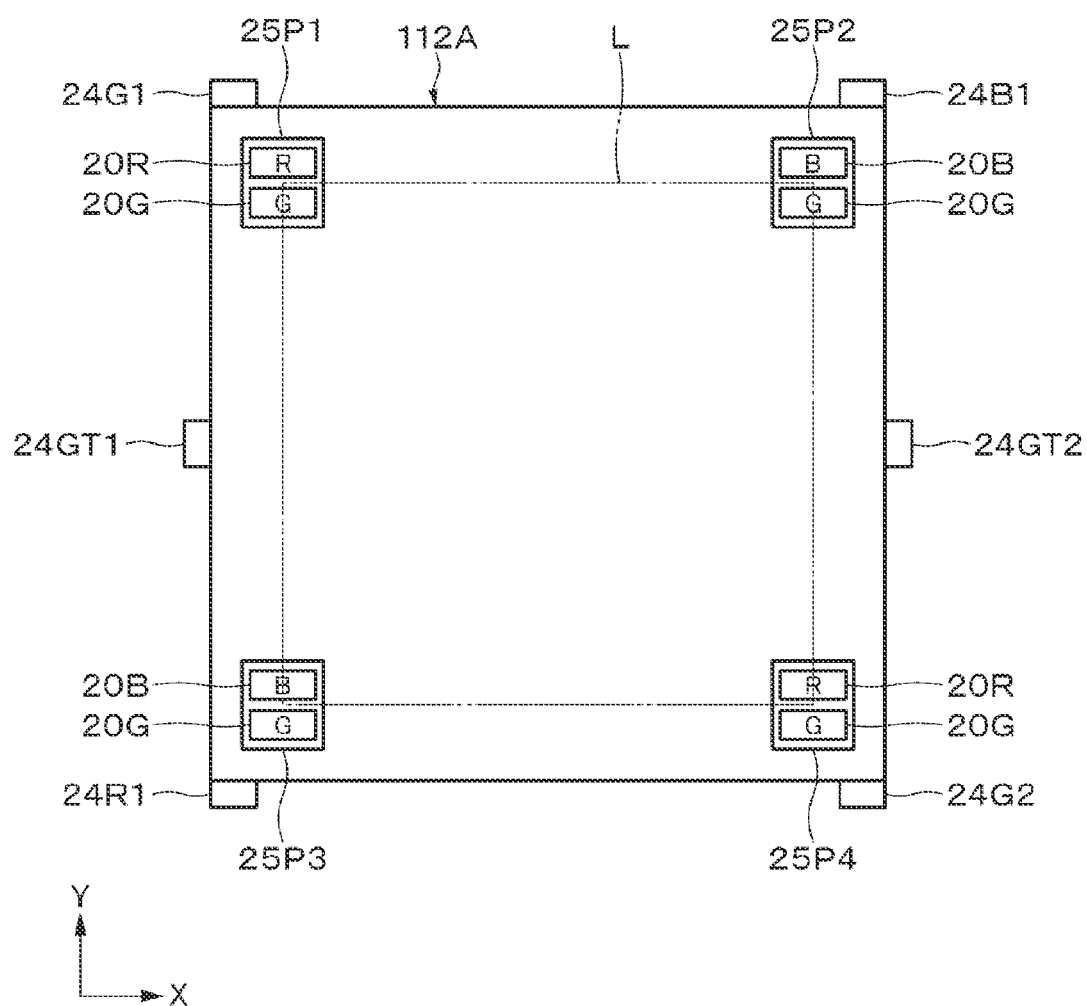
FIG. 5A is a plane view illustrating a configuration of an SMD provided on a display device according to Comparative Example 2.
Figure 5B:
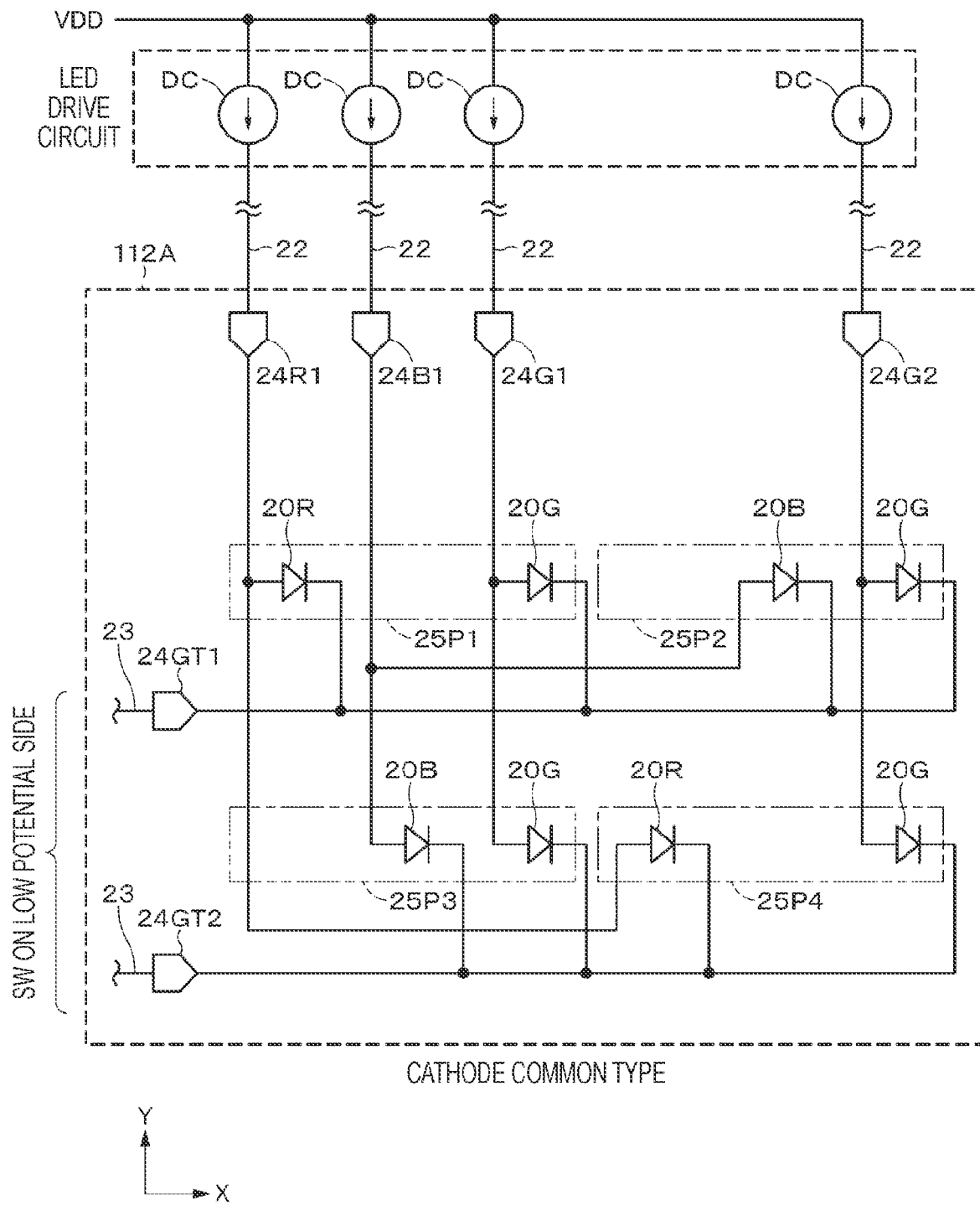
FIG. 5B is a circuit diagram illustrating a circuit of the SMD provided on the display device according to Comparative Example 2.

FIG. 5A is a plane view illustrating a configuration of an SMD 112A provided on the display device according to Comparative Example 2. FIG. 5B is a circuit diagram illustrating a circuit of the SMD 112A provided on the display device according to Comparative Example 2.

The display device according to Comparative Example 2 is provided with a plurality of SMDs 112A having the following configurations.

Both anodes of green LED elements 20G included in a first pixel 25P1 and a third pixel 25P3 are connected to an anode terminal 24G1. Cathodes of the green LED elements 20G included in the first pixel 25P1 and the third pixel 25P3 are connected to a cathode terminal 24GT1 and a cathode terminal 24GT2, respectively.

Both the anodes of the green LED elements 20G included in a second pixel 25P2 and a fourth pixel 25P4 are connected to an anode terminal 24G2. The cathodes of the green LED elements 20G included in the second pixel 25P2 and the fourth pixel 25P4 are connected to the cathode terminal 24GT1 and the cathode terminal 24GT2, respectively.

Since the display device according to Comparative Example 2 is provided with a plurality of SMDs 12A having the above-described configurations, the number of scanning lines 23 is two for one SMD 12A, but the number of signal lines 22 is four for one SMD 12A. Therefore, the number of scanning lines 23 is large, and it is difficult to provide a margin to L/S of the signal lines 22.

The display device according to the second embodiment is provided with the plurality of SMDs 12A having the following configurations.

All anodes of green LED elements 20G included in the first pixel 25P1, the second pixel 25P2, the third pixel 25P3, and the fourth pixel 25P4 are connected to an anode terminal 24G1. Cathodes of the green LED elements 20G included in the first pixel 25P1, the second pixel 25P2, the third pixel 25P3, and the fourth pixel 25P4 are connected to the cathode terminals 24GT1, 24GT2, 24GT3, and 24GT4, respectively.

Since the display device according to the second embodiment is provided with the plurality of SMDs 12A having the above-described configurations, the number of signal lines 22 is three for one SMD 12. Therefore, since the number of scanning lines 23 may be reduced by one with respect to the display device according to Comparative Example 2, the action and effect similar to those of the display device 10 according to the first embodiment may be obtained.

Furthermore, in the display device according to the second embodiment, the blue LED element 20B is thinned out from the first pixel 21P1 and the fourth pixel 21P4 (refer to FIG. 2A) of the first embodiment to form the first pixel 25P1 and the fourth pixel 25P4, respectively. Furthermore, the red LED element 20R is thinned out from the second pixel 21P2 and the third pixel 21P3 (refer to FIG. 2A) of the first embodiment to form the second pixel 25P2 and the third pixel 25P3, respectively. Therefore, since the number of LED elements may be reduced, the number of components of the display device may be reduced. Therefore, reliability of the display device may be improved, and a cost of the display device may be reduced. Furthermore, manufacturing processes may be further reduced.

Since each of the first pixel 25P1, the second pixel 25P2, the third pixel 25P3, and the fourth pixel 25P4 is provided with the green LED element 20G having a high luminosity factor, even if the blue LED element 20B or the red LED element 20R is thinned out from the LED elements of three colors, deterioration in sense of resolution (image quality) may be suppressed.

3 Variation (Variation 1)

Figure 6A:
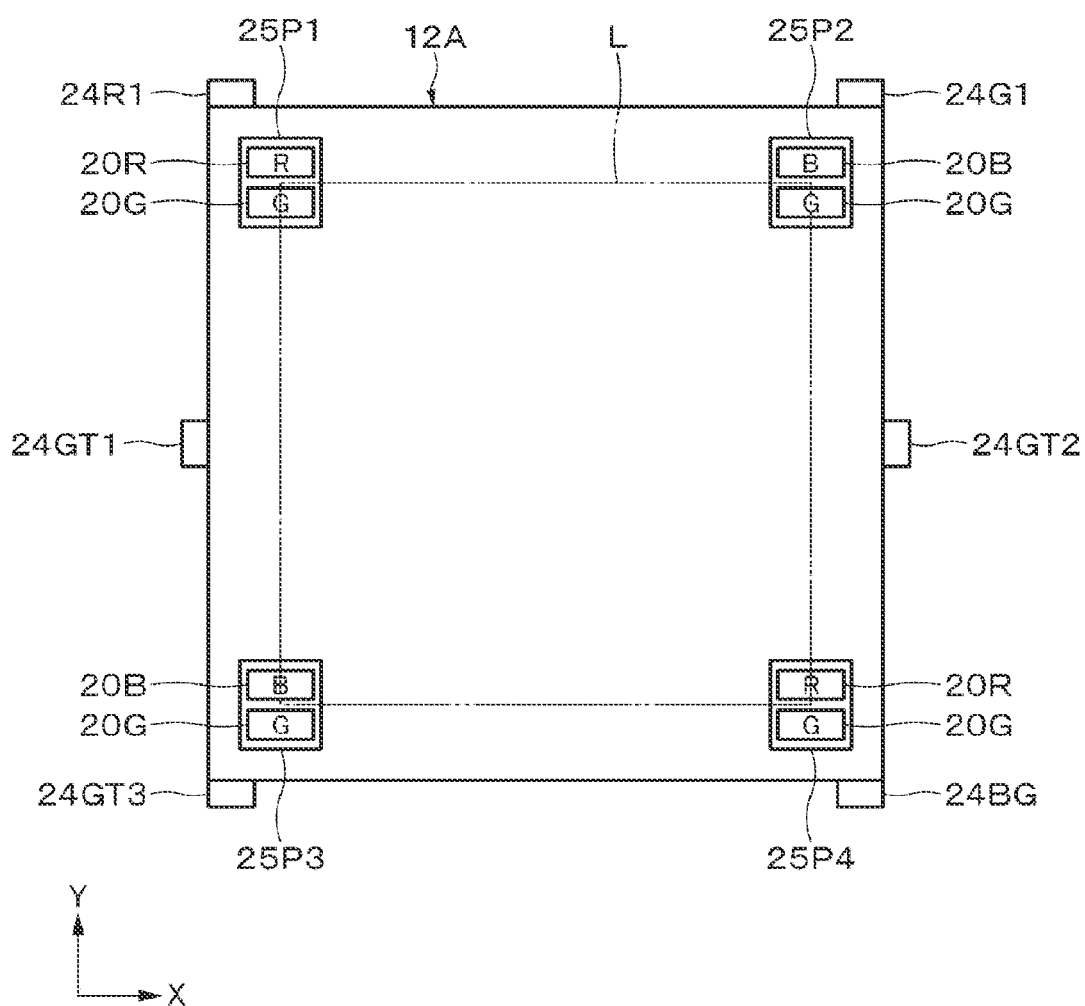
FIG. 6A is a plane view illustrating a configuration of an SMD provided on a display device according to Variation 1.

In the second embodiment, the example in which the SMD 12A is provided with the anode terminal 24R1, the anode terminal 24G1, and the anode terminal 24B1 (refer to FIG. 4A) has been described; however, as illustrated in FIG. 6A, this may be provided with an anode terminal 24BG in place of the anode terminal 24B1. Furthermore, in the second embodiment, the example in which the SMD 12A is provided with the cathode terminal 24GT1, the cathode terminal 24GT2, the cathode terminal 24GT3, and the cathode terminal 24GT4 (refer to FIG. 4A) has been described; however, as illustrated in FIG. 6A, the SMD 12A is not necessarily provided with the cathode terminal 24GT4.

Figure 6B:
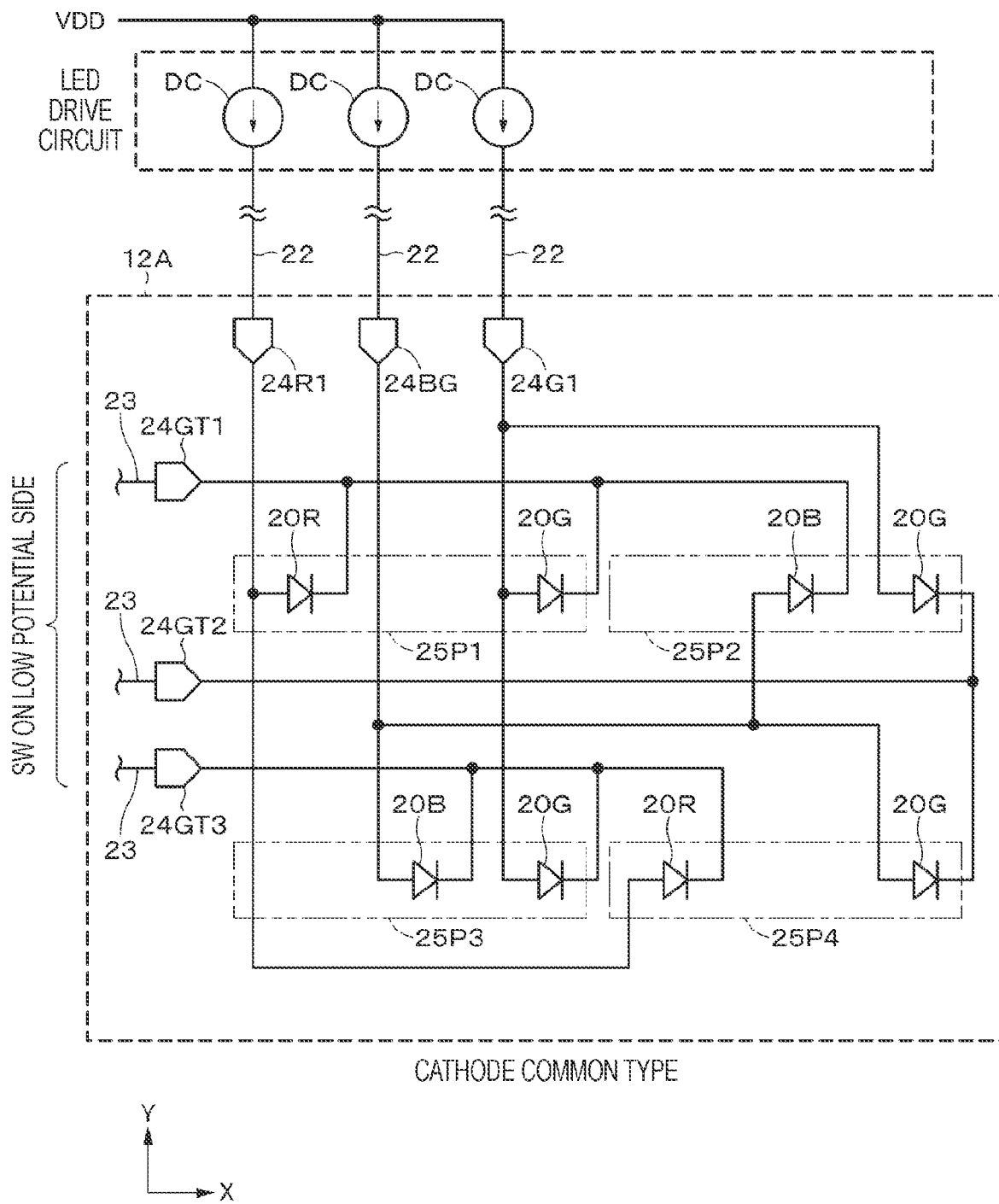
FIG. 6B is a circuit diagram illustrating an example of a circuit of the SMD provided on the display device according to Variation 1.

The SMD 12A having a terminal configuration described above may have the following circuit configuration. An anode of a blue LED element 20B included in a second pixel 25P2 is connected to the anode terminal 24BG as illustrated in FIG. 6B instead of being connected to the anode terminal 24B1 (refer to FIG. 4A). A cathode of the blue LED element 20B included in the second pixel 25P2 is connected to the cathode terminal 24GT1 as illustrated in FIG. 6B instead of being connected to the cathode terminal 24GT2 (refer to FIG. 4A).

The anode of the blue LED element 20B included in a third pixel 25P3 is connected to the anode terminal 24BG as illustrated in FIG. 6B instead of being connected to the anode terminal 24B1 (refer to FIG. 4A).

A cathode of a red LED element 20R included in a fourth pixel 25P4 is connected to the cathode terminal 24GT3 as illustrated in FIG. 6B instead of being connected to the cathode terminal 24GT4 (refer to FIG. 4A). An anode of a green LED element 20G included in the fourth pixel 25P4 is connected to the anode terminal 24BG as illustrated in FIG. 6B instead of being connected to the anode terminal 24G1 (refer to FIG. 4A). A cathode of the green LED element 20G included in the fourth pixel 25P4 is connected to the cathode terminal 24GT2 as illustrated in FIG. 6B instead of being connected to the cathode terminal 24GT4 (refer to FIG. 4A).

In the SMD 12A having the above-described configuration, since the cathode terminal (gate terminal) 24GT4 may be reduced, the number of scanning lines 23 for one SMD 12A may be reduced from four to three.

(Variation 2)

In the first and second embodiments, the example has been described in which the SMD 12 is of the cathode common type in which the cathode is the common terminal, but this may be of an anode common type in which an anode is a common terminal. In an anode common type SMD 12, a gate (switch) is provided on a common anode side of each of LED elements 20R, 20G, and 20B, it is switched on a power supply side (high potential side), and a current is drawn from each of the LED elements 20R, 20G, and 20B by a current source on a cathode side.

Figure 7:
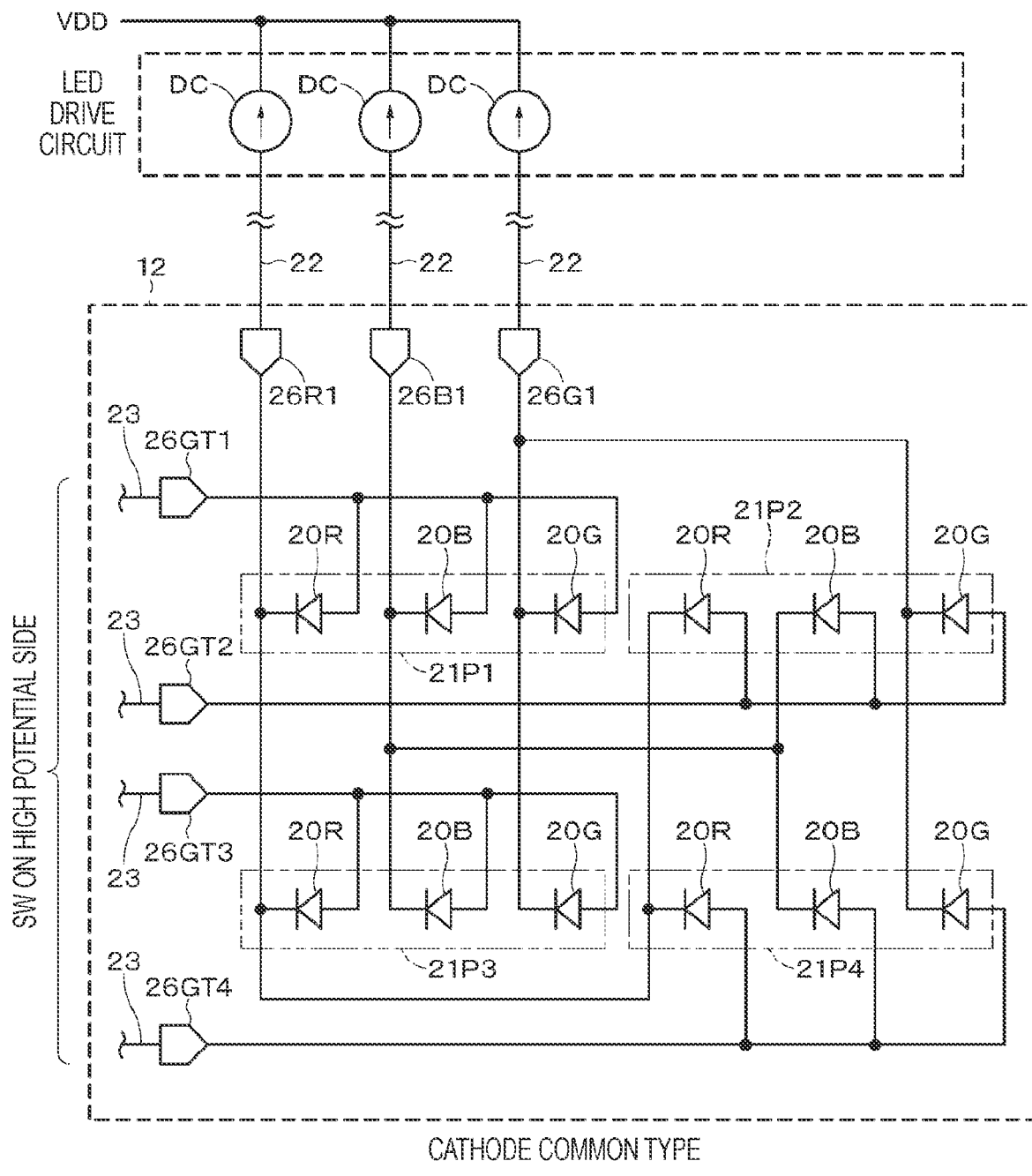
FIG. 7 is a circuit diagram illustrating an example of a circuit of an SMD provided on a display device according to Variation 2.

FIG. 7 is a circuit diagram illustrating an example of a circuit of the anode common type SMD 12. The anode common type SMD 12 is provided with an anode terminal (gate terminal) 26GT1, an anode terminal (gate terminal) 26GT2, an anode terminal (gate terminal) 26GT3, an anode terminal (gate terminal) 26GT4, a cathode terminal 26R1, a cathode terminal 26G1, and a cathode terminal 26B1. The anode terminal 26GT1, the anode terminal 26GT2, the anode terminal 26GT3, and the anode terminal 26GT4 are the common terminals.

In Variation 2, the cathode terminal 26G1, the cathode terminal 26G2, and the cathode terminal 26B2 are examples of a first terminal, a second terminal, and a third terminal, respectively. The anode terminal 26GT1, the anode terminal 26GT2, the anode terminal 26GT3, and the anode terminal 26GT4 are examples of a fourth terminal, a fifth terminal, a sixth terminal, and a seventh terminal, respectively.

In Variation 2, a cathode provided on each of the red LED element 20R, the green LED element 20G, and the blue LED element 20B is an example of a first electrode, and an anode provided on each of the red LED element 20R, the green LED element 20G, and the blue LED element 20B is an example of a second electrode.

The cathodes (first electrodes) of the red LED elements 20R included in the first pixel 21P1, the second pixel 21P2, the third pixel 21P3, and the fourth pixel 21P4 are connected to the cathode terminal 26R1. The anodes (second electrodes) of the red LED elements 20R included in the first pixel 21P1, the second pixel 21P2, the third pixel 21P3, and the fourth pixel 21P4 are connected to the anode terminal 26GT1, the anode terminal 26GT2, the anode terminal 26GT3, and the anode terminal 26GT4, respectively.

The cathodes (first electrodes) of the green LED elements 20G included in the first pixel 21P1, the second pixel 21P2, the third pixel 21P3, and the fourth pixel 21P4 are connected to the cathode terminal 26G1. The anodes (second electrodes) of the green LED elements 20G included in the first pixel 21P1, the second pixel 21P2, the third pixel 21P3, and the fourth pixel 21P4 are connected to the anode terminal 26GT1, the anode terminal 26GT2, the anode terminal 26GT3, and the anode terminal 26GT4, respectively.

The cathodes (first electrodes) of the blue LED elements 20B included in the first pixel 21P1, the second pixel 21P2, the third pixel 21P3, and the fourth pixel 21P4 are connected to the cathode terminal 26B1. The anodes (second electrodes) of the blue LED elements 20B included in the first pixel 21P1, the second pixel 21P2, the third pixel 21P3, and the fourth pixel 21P4 are connected to the anode terminal 26GT1, the anode terminal 26GT2, the anode terminal 26GT3, and the anode terminal 26GT4, respectively.

The cathode terminal 26R1, the cathode terminal 26G1, and the cathode terminal 26B1 are connected to different signal lines 22, respectively. The anode terminal 26GT1, the anode terminal 26GT2, the anode terminal 26GT3, and the anode terminal 26GT4 are connected to different scanning lines 23, respectively. In the anode common type SMD 12, a current is drawn from each of the LED elements 20R, 20G, and 20B by the driver.

Note that, in the second embodiment also, the SMD 12 may be of the anode common type instead of the cathode common type.

(Variation 3)

In the first embodiment described above, the example has been described in which the red light source, the green light source, and the blue light source provided on the first pixel 21P1, the second pixel 21P2, the third pixel 21P3, and the fourth pixel 21P4 are the red LED element 20R, the green LED element 20G, and the blue LED element 20B, respectively, but the light source is not limited to this example.

Figure 8A:
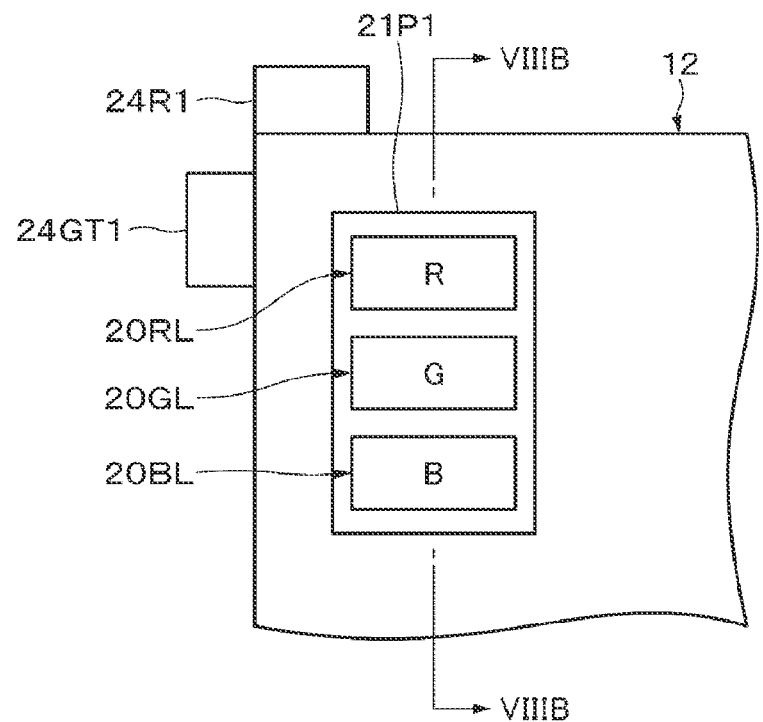
FIG. 8A is a plane view illustrating a first configuration example of a red light source, a green light source, and a blue light source provided on a first pixel.
Figure 8B:
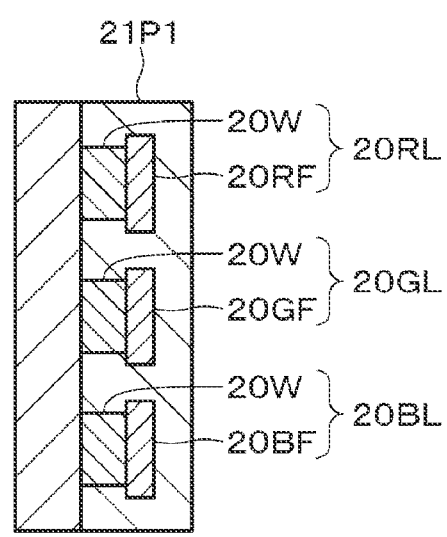
FIG. 8B is a cross-sectional view taken along line VIIIB-VIIIB of FIG. 8A.

FIGS. 8A and 8B are views illustrating a first configuration example of a red light source 20RL, a green light source 20GL, and a blue light source 20BL provided on a first pixel 21P1. Since configurations of the first pixel 21P1, a second pixel 21P2, a third pixel 21P3, and a fourth pixel 21P4 may be made the same as the configuration of the first pixel 21P1, the description of the configurations of the second pixel 21P2, the third pixel 21P3, and the fourth pixel 21P4 are omitted below.

The red light source 20RL provided on the first pixel 21P1 may include, instead of the red LED element 20R, a white LED element 20W and a red filter 20RF provided on the white LED element 20W. The white LED element 20W is configured to be able to emit white light. The red filter 20RF absorbs light having a specified wavelength among the white light emitted from the white LED element 20W and transmits red light.

The green light source 20GL provided on the first pixel 21P1 may include, instead of the green LED element 20G, the white LED element 20W and a green filter 20GF provided on the white LED element 20W. The green filter 20GF absorbs light having a specified wavelength among the white light emitted from the white LED element 20W and transmits green light.

The blue light source 20BL provided on the first pixel 21P1 may include, instead of the blue LED element 20B, the white LED element 20W and a blue filter 20BF provided on the white LED element 20W. The blue filter 20BF absorbs light having a specified wavelength among the white light emitted from the white LED element 20W and transmits blue light.

Figure 9:
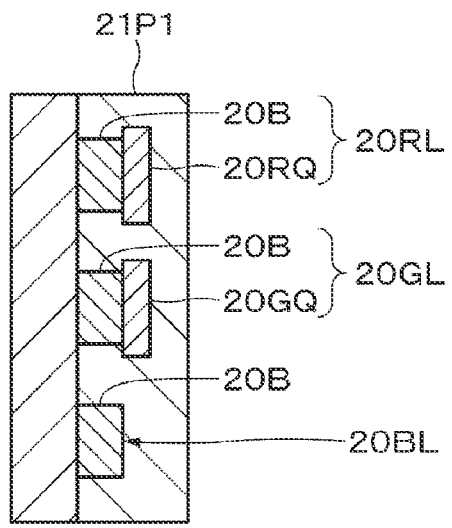
FIG. 9 is a cross-sectional view illustrating a second configuration example of the red light source, the green light source, and the blue light source provided on the first pixel.

FIG. 9 is a view illustrating a second configuration example of the red light source 20RL, the green light source 20GL, and the blue light source 20BL provided on the first pixel 21P1. The red light source 20RL provided on the first pixel 21P1 may include, instead of the red LED element 20R, the blue LED element 20B and a color conversion layer 20RQ provided on the blue LED element 20B. The color conversion layer 20RQ converts the blue light emitted from the blue LED element 20B into the red light. The color conversion layer 20RQ is, for example, a quantum dot (QD).

The green light source 20GL provided on the first pixel 21P1 may include, instead of the green LED element 20G, the blue LED element 20B and a color conversion layer 20GQ provided on the blue LED element 20B. The color conversion layer 20GQ converts the blue light emitted from the blue LED element 20B into the green light. The color conversion layer 20GQ is, for example, a quantum dot.

The blue light source 20BL is the blue LED element 20B as in the first embodiment.

(Variation 4)

In the second embodiment described above, the example has been described in which the red light source and the green light source provided on the first pixel 25P1 and the fourth pixel 25P4 are the red LED element 20R and the green LED element 20G, respectively, and the blue light source and the green light source provided on the second pixel 25P2 and the third pixel 25P3 are the blue LED element 20B and the green LED element 20G, respectively, but the light source is not limited to this example.

Figure 10A:
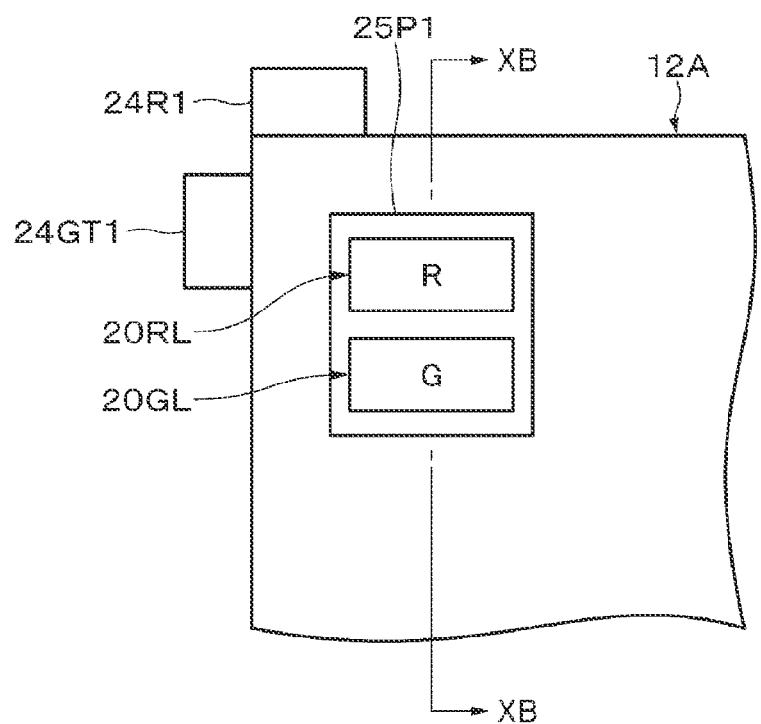
FIG. 10A is a plane view illustrating a first variation of a red light source and a green light source provided on the first pixel.
Figure 10B:
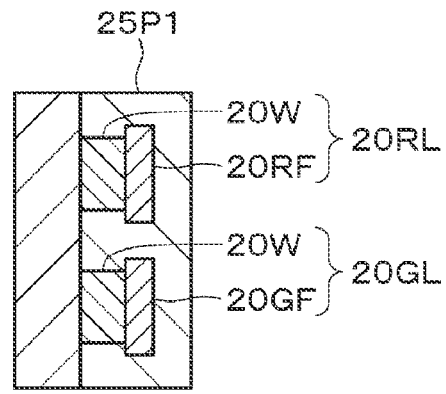
FIG. 10B is a cross-sectional view taken along line XB-XB of FIG. 10A.

FIGS. 10A and 10B are views illustrating a first variation of a red light source 20RL and a green light source 20GL provided on a first pixel 25P1. Since a configuration of a fourth pixel 25P4 may be made the same as that of the first pixel 25P1, the description of the configuration of the fourth pixel 25P4 is omitted below.

The red light source 20RL provided on the first pixel 25P1 may include, instead of the red LED element 20R, a white LED element 20W and a red filter 20RF provided on the white LED element 20W.

The green light source 20GL provided on the first pixel 25P1 may include, instead of the green LED element 20G, the white LED element 20W and a green filter 20GF provided on the white LED element 20W.

Figure 11A:
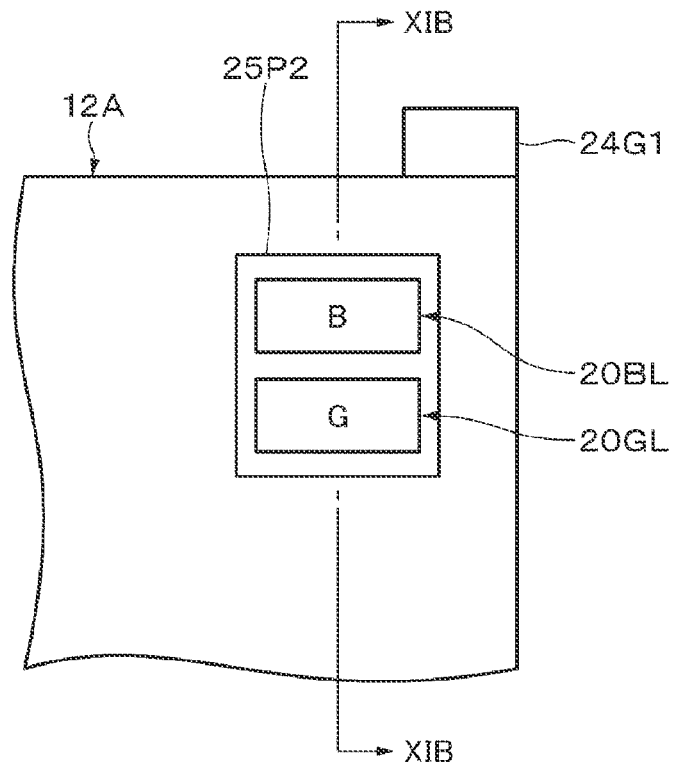
FIG. 11A is a view illustrating a first variation of a blue light source and a green light source provided on a second pixel.
Figure 11B:
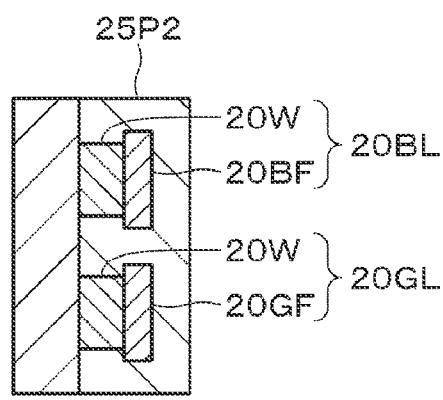
FIG. 11B is a cross-sectional view taken along line XIB-XIB of FIG. 11A.

FIGS. 11A and 11B are views illustrating a first variation of a blue light source 20BL and the green light source 20GL provided on a second pixel 25P2. Since a configuration of a third pixel 25P3 may be made the same as that of the second pixel 25P2, the description of the configuration of the third pixel 25P3 is omitted below.

The blue light source 20BL provided on the second pixel 25P2 may include, instead of the blue LED element 20B, the white LED element 20W and a blue filter 20BF provided on the white LED element 20W.

The green light source 20GL provided on the second pixel 25P2 may include, instead of the green LED element 20G, the white LED element 20W and the green filter 20GF provided on the white LED element 20W.

Figure 12:
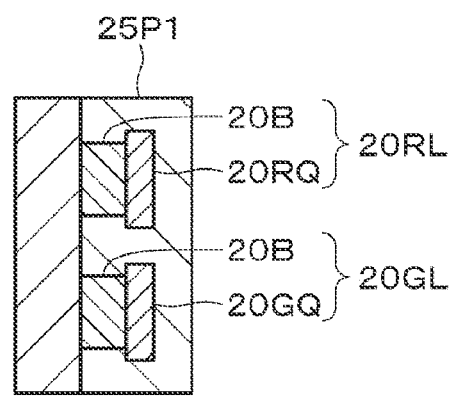
FIG. 12 is a view illustrating a second variation of a red light source and a green light source provided on the first pixel.

FIG. 12 is a view illustrating a second variation of the red light source 20RL and the green light source 20GL provided on the first pixel 25P1. The red light source 20RL provided on the first pixel 25P1 may include, instead of the red LED element 20R, the blue LED element 20B and a color conversion layer 20RQ provided on the blue LED element 20B. The color conversion layer 20RQ is as described in Variation 3.

The green light source 20GL provided on the first pixel 25P1 may include, instead of the green LED element 20G, the blue LED element 20B and a color conversion layer 20GQ provided on the blue LED element 20B. The color conversion layer 20GQ is as described in Variation 3.

Figure 13:
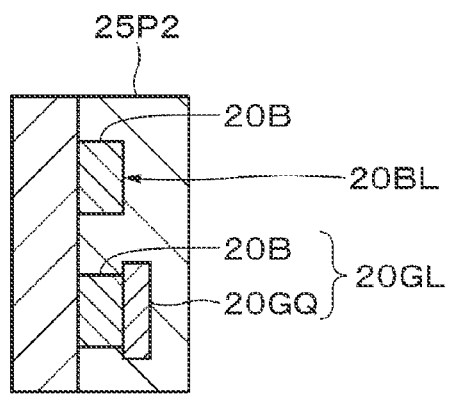
FIG. 13 is a view illustrating a second configuration example of the blue light source and the green light source provided on the second pixel.

FIG. 13 is a view illustrating a second configuration example of the blue light source 20BL and the green light source 20GL provided on the second pixel 25P2. The blue light source 20BL provided on the second pixel 25P2 is the blue LED element 20B as in the first embodiment.

The green light source 20GL provided on the second pixel 25P2 may include, instead of the green LED element 20G, the blue LED element 20B and a color conversion layer 20GQ provided on the blue LED element 20B. The color conversion layer 20GQ is as described in Variation 3.

Although the first and second embodiments and variations thereof of the present disclosure are specifically described above, the present disclosure is not limited to the above-described first and second embodiments and variations, and various modifications based on the technical idea of the present disclosure may be made.

For example, the configuration, method, shape and the like described in the above-described first and second embodiments and variations are merely examples, and the configuration, method, shape and the like different from those may also be used as necessary.

The configuration, method, shape and the like of the above-described first and second embodiments and variations thereof may be combined with one another without departing from the gist of the present disclosure.

Furthermore, the present disclosure may also adopt the following configurations.

(1)
A display device provided with:
a substrate;
a plurality of surface mount devices two-dimensionally arranged on the substrate in a first direction and a second direction; and
a plurality of signal lines and a plurality of scanning lines arranged on the substrate, in which
a surface mount device is provided with four pixels,
each of the four pixels is provided with light sources of three colors, and each of the light sources of three colors includes a light emitting diode element,
a plurality of the scanning lines extends in the first direction,
a plurality of the signal lines extends in the second direction,
the number of the signal lines is three for two pixels arranged in the first direction, and
the number of the scanning lines is four for two pixels arranged in the second direction.

(2)
The display device according to (1), in which the light sources of three colors are a red light source, a green light source, and a blue light source.

(3)
The display device according to (2), in which
the light emitting diode element included in the red light source is a red light emitting diode element,
the light emitting diode element included in the green light source is a green light emitting diode element, and
the light emitting diode element included in the blue light source is a blue light emitting diode element.

(4)
The display device according to any one of (1) to (3), in which each of the light sources of three colors further includes a filter provided on the light emitting diode element.

(5)
The display device according to (1) or (2), in which each of light sources of two colors of the light sources of three colors further includes a color conversion layer provided on the light emitting diode element.

(6)
The display device according to (5), in which
the light emitting diode element is a blue light emitting diode element, and
the light sources of two colors are a red light source and a green light source.

(7)
The display device according to (1), in which
the surface mount device further is further provided with:
a first terminal, a second terminal, and a third terminal connected to different signal lines, respectively; and
a fourth terminal, a fifth terminal, a sixth terminal, and a seventh terminal connected to different scanning lines, respectively.

(8)
The display device according to (7), in which
the light sources of three colors are a first color light source, a second color light source, and a third color light source,
the four pixels is provided with a first pixel, a second pixel, a third pixel, and a fourth pixel,
first electrodes of first color light sources provided on the first pixel, the second pixel, the third pixel, and the fourth pixel, respectively, are connected to the first terminal,
second electrodes of the first color light sources provided on the first pixel, the second pixel, the third pixel, and the fourth pixel are connected to the fourth terminal, the fifth terminal, the sixth terminal, and the seventh terminal, respectively,
first electrodes of second color light sources provided on the first pixel, the second pixel, the third pixel, and the fourth pixel respectively, are connected to the second terminal,
second electrodes of the second color light sources provided on the first pixel, the second pixel, the third pixel, and the fourth pixel are connected to the fourth terminal, the fifth terminal, the sixth terminal, and the seventh terminal, respectively,
first electrodes of third color light sources provided on the first pixel, the second pixel, the third pixel, and the fourth pixel, respectively, are connected to the third terminal, and
second electrodes of the third color light sources provided on the first pixel, the second pixel, the third pixel, and the fourth pixel are connected to the fourth terminal, the fifth terminal, the sixth terminal, and the seventh terminal, respectively.

(9)

The display device according to (8), in which the first color light source, the second color light source, and the third color light source are a red light source, a green light source, and a blue light source, respectively.

(10)

A display device provided with:
a substrate;
a plurality of surface mount devices two-dimensionally arranged on the substrate in a first direction and a second direction; and
a plurality of signal lines and a plurality of scanning lines arranged on the substrate, in which
a surface mount device is provided with four pixels,
each of the four pixels is provided with light sources of two colors, and each of the light sources of two colors includes a light emitting diode element,
a plurality of the scanning lines extends in the first direction,
a plurality of the signal lines extends in the second direction,
the number of the signal lines is three for two pixels arranged in the first direction, and
the number of the scanning lines is three or four for two pixels arranged in the second direction.

(11)

The display device according to (10), in which
the four pixels is provided with a first pixel, a second pixel, a third pixel, and a fourth pixel,
the first pixel and the fourth pixel are diagonally arranged, and
the second pixel and the third pixel are diagonally arranged.

(12)

The display device according to (11), in which
the light sources of two colors included in the first pixel and the fourth pixel are a first color light source and a second color light source, and
the light sources of two colors included in the second pixel and the third pixel are the second color light source and a third color light source.

(13)

The display device according to (12), in which the first color light source, the second color light source, and the third color light source are a red light source, a green light source, and a blue light source, respectively.

(14)

The display device according to (12) or (13), in which
the number of the scanning lines is four for two pixels arranged in the second direction, and
the surface mount device is further provided with:
a first terminal, a second terminal, and a third terminal connected to different signal lines, respectively; and
a fourth terminal, a fifth terminal, a sixth terminal, and a seventh terminal connected to different scanning lines, respectively.

(15)

The display device according to (14), in which
first electrodes of first color light sources provided on the first pixel and the fourth pixel, respectively, are connected to the first terminal,
second electrodes of the first color light sources provided on the first pixel and the fourth pixel are connected to the fourth terminal and the seventh terminal, respectively,
first electrodes of second color light sources provided on the first pixel, the second pixel, the third pixel, and the fourth pixel, respectively, are connected to the second terminal,
second electrodes of the second color light sources provided on the first pixel, the second pixel, the third pixel, and the fourth pixel are connected to the fourth terminal, the fifth terminal, the sixth terminal, and the seventh terminal, respectively,
first electrodes of third color light sources provided on the second pixel and the third pixel, respectively, are connected to the third terminal, and
second electrodes of the third color light sources provided on the second pixel and the third pixel are connected to the fifth terminal and the sixth terminal, respectively.

(16)

The display device according to (12) or (13), in which
the number of the scanning lines is three for two pixels arranged in the second direction, and
the surface mount device is further provided with:
a first terminal, a second terminal, and a third terminal connected to different signal lines, respectively; and
a fourth terminal, a fifth terminal, and a sixth terminal connected to different scanning lines, respectively.

(17)

The display device according to (16), in which
first electrodes of first color light sources provided on the first pixel and the fourth pixel, respectively, are connected to the first terminal,
second electrodes of the first color light sources provided on the first pixel and the fourth pixel are connected to the fourth terminal and the sixth terminal, respectively,
first electrodes of second color light sources provided on the first pixel, the second pixel, and the third pixel, respectively, are connected to the second terminal,
second electrodes of the second color light sources provided on the first pixel, the second pixel, and the third pixel are connected to the fourth terminal, the fifth terminal, and the sixth terminal, respectively,
a first electrode of the second color light source included in the fourth pixel is connected to the third terminal, and a second electrode of the second color light source included in the fourth pixel is connected to the fifth terminal,
first electrodes of third color light sources provided on the second pixel and the third pixel, respectively, are connected to the third terminal, and
second electrodes of the third color light sources provided on the second pixel and the third pixel are connected to the fourth terminal and the sixth terminal, respectively.

(18)

A surface mount device used in a display device, the surface mount device provided with:
four pixels;
a first terminal, a second terminal, and a third terminal connected to different signal lines, respectively; and
a fourth terminal, a fifth terminal, a sixth terminal, and a seventh terminal connected to different scanning lines, respectively, in which
each of the four pixels is provided with light sources of three colors, and each of the light sources of three colors includes a light emitting diode element.

(19)

A surface mount device used in a display device, the surface mount device provided with:
- four pixels;
- a first terminal, a second terminal, and a third terminal connected to different signal lines, respectively; and
- a fourth terminal, a fifth terminal, a sixth terminal, and a seventh terminal connected to different scanning lines, respectively, in which
- each of the four pixels is provided with light sources of two colors, and each of the light sources of two colors includes a light emitting diode element.

(20)

A surface mount device used in a display device, the surface mount device provided with:
- four pixels;
- a first terminal, a second terminal, and a third terminal connected to different signal lines, respectively; and
- a fourth terminal, a fifth terminal, and a sixth terminal connected to different scanning lines, respectively, in which
- each of the four pixels is provided with light sources of two colors, and each of the light sources of two colors includes a light emitting diode element.

REFERENCE SIGNS LIST

10 Display device
11 Substrate
12, 12A, 112, 112A SMD
20R Red LED element
20G Green LED element
20B Blue LED element
20Y Yellow LED element
20W White LED element
20RL Red light source
20GL Green light source
20BL Blue light source
20RF Red filter
20GF Green filter
20BF Blue filter
20RQ, 20GQ Color conversion layer
21P1, 25P1 First pixel
21P2, 25P2 Second pixel
21P3, 25P3 Third pixel
21P4, 25P4 Fourth pixel
22 Signal line
23 Scanning line
24R1, 24R2, 24G1, 24G2, 24B1, 24B2, 24BG Anode terminal
24GT1, 24GT2, 24GT3, 24GT4 Cathode terminal
25R1, 25R2, 25R3 Cathode terminal
25GT1, 25GT2, 25GT3, 25GT4 Anode terminal
DC Direct current source

What is claimed is:

1. A display device comprising:
a substrate;
a plurality of surface mount devices two-dimensionally arranged on the substrate in a first direction and a second direction; and
a plurality of signal lines and a plurality of scanning lines arranged on the substrate, wherein
a surface mount device is provided with four pixels,
each of the four pixels is provided with light sources of three colors, and each of the light sources of three colors includes a light emitting diode element,
a plurality of the scanning lines extends in the first direction,
a plurality of the signal lines extends in the second direction,
a number of the signal lines is three for two pixels arranged in the first direction, and
a number of the scanning lines is four for two pixels arranged in the second direction.

2. The display device according to claim 1, wherein the light sources of three colors are a red light source, a green light source, and a blue light source.

3. The display device according to claim 2, wherein
the light emitting diode element included in the red light source is a red light emitting diode element,
the light emitting diode element included in the green light source is a green light emitting diode element, and
the light emitting diode element included in the blue light source is a blue light emitting diode element.

4. The display device according to claim 1, wherein each of the light sources of three colors further includes a filter provided on the light emitting diode element.

5. The display device according to claim 1, wherein each of light sources of two colors of the light sources of three colors further includes a color conversion layer provided on the light emitting diode element.

6. The display device according to claim 5, wherein
the light emitting diode element is a blue light emitting diode element, and
the light sources of two colors are a red light source and a green light source.

7. The display device according to claim 1, wherein the surface mount device further is further provided with:
a first terminal, a second terminal, and a third terminal connected to different signal lines, respectively; and
a fourth terminal, a fifth terminal, a sixth terminal, and a seventh terminal connected to different scanning lines, respectively.

8. The display device according to claim 7, wherein
the light sources of three colors are a first color light source, a second color light source, and a third color light source,
the four pixels is provided with a first pixel, a second pixel, a third pixel, and a fourth pixel,
first electrodes of first color light sources provided on the first pixel, the second pixel, the third pixel, and the fourth pixel, respectively, are connected to the first terminal,
second electrodes of the first color light sources provided on the first pixel, the second pixel, the third pixel, and the fourth pixel are connected to the fourth terminal, the fifth terminal, the sixth terminal, and the seventh terminal, respectively,
first electrodes of second color light sources provided on the first pixel, the second pixel, the third pixel, and the fourth pixel respectively, are connected to the second terminal,
second electrodes of the second color light sources provided on the first pixel, the second pixel, the third pixel, and the fourth pixel are connected to the fourth terminal, the fifth terminal, the sixth terminal, and the seventh terminal, respectively,
first electrodes of third color light sources provided on the first pixel, the second pixel, the third pixel, and the fourth pixel, respectively, are connected to the third terminal, and
second electrodes of the third color light sources provided on the first pixel, the second pixel, the third pixel, and the fourth pixel are connected to the fourth terminal, the fifth terminal, the sixth terminal, and the seventh terminal, respectively.

9. The display device according to claim 8, wherein the first color light source, the second color light source, and the third color light source are a red light source, a green light source, and a blue light source, respectively.

10. A display device comprising:
a substrate;
a plurality of surface mount devices two-dimensionally arranged on the substrate in a first direction and a second direction; and
a plurality of signal lines and a plurality of scanning lines arranged on the substrate, wherein
a surface mount device is provided with four pixels,
each of the four pixels is provided with light sources of two colors, and each of the light sources of two colors includes a light emitting diode element,
a plurality of the scanning lines extends in the first direction,
a plurality of the signal lines extends in the second direction,
a number of the signal lines is three for two pixels arranged in the first direction, and
a number of the scanning lines is three or four for two pixels arranged in the second direction.

11. The display device according to claim 10, wherein
the four pixels is provided with a first pixel, a second pixel, a third pixel, and a fourth pixel,
the first pixel and the fourth pixel are diagonally arranged, and
the second pixel and the third pixel are diagonally arranged.

12. The display device according to claim 11, wherein
the light sources of two colors included in the first pixel and the fourth pixel are a first color light source and a second color light source, and
the light sources of two colors included in the second pixel and the third pixel are the second color light source and a third color light source.

13. The display device according to claim 12, wherein the first color light source, the second color light source, and the third color light source are a red light source, a green light source, and a blue light source, respectively.

14. The display device according to claim 12, wherein
a number of the scanning lines is four for two pixels arranged in the second direction, and
the surface mount device is further provided with:
a first terminal, a second terminal, and a third terminal connected to different signal lines, respectively; and
a fourth terminal, a fifth terminal, a sixth terminal, and a seventh terminal connected to different scanning lines, respectively.

15. The display device according to claim 14, wherein
first electrodes of first color light sources provided on the first pixel and the fourth pixel, respectively, are connected to the first terminal,
second electrodes of the first color light sources provided on the first pixel and the fourth pixel are connected to the fourth terminal and the seventh terminal, respectively,
first electrodes of second color light sources provided on the first pixel, the second pixel, the third pixel, and the fourth pixel, respectively, are connected to the second terminal,
second electrodes of the second color light sources provided on the first pixel, the second pixel, the third pixel, and the fourth pixel are connected to the fourth terminal, the fifth terminal, the sixth terminal, and the seventh terminal, respectively,
first electrodes of third color light sources provided on the second pixel and the third pixel, respectively, are connected to the third terminal, and
second electrodes of the third color light sources provided on the second pixel and the third pixel are connected to the fifth terminal and the sixth terminal, respectively.

16. The display device according to claim 12, wherein
a number of the scanning lines is three for two pixels arranged in the second direction, and
the surface mount device is further provided with:
a first terminal, a second terminal, and a third terminal connected to different signal lines, respectively; and
a fourth terminal, a fifth terminal, and a sixth terminal connected to different scanning lines, respectively.

17. The display device according to claim 16, wherein
first electrodes of first color light sources provided on the first pixel and the fourth pixel, respectively, are connected to the first terminal,
second electrodes of the first color light sources provided on the first pixel and the fourth pixel are connected to the fourth terminal and the sixth terminal, respectively,
first electrodes of second color light sources provided on the first pixel, the second pixel, and the third pixel, respectively, are connected to the second terminal,
second electrodes of the second color light sources provided on the first pixel, the second pixel, and the third pixel are connected to the fourth terminal, the fifth terminal, and the sixth terminal, respectively,
a first electrode of the second color light source included in the fourth pixel is connected to the third terminal, and a second electrode of the second color light source included in the fourth pixel is connected to the fifth terminal,
first electrodes of third color light sources provided on the second pixel and the third pixel, respectively, are connected to the third terminal, and
second electrodes of the third color light sources provided on the second pixel and the third pixel are connected to the fourth terminal and the sixth terminal, respectively.

18. A surface mount device used in a display device, the surface mount device comprising:
four pixels;
a first terminal, a second terminal, and a third terminal connected to different signal lines, respectively; and
a fourth terminal, a fifth terminal, a sixth terminal, and a seventh terminal connected to different scanning lines, respectively, wherein
each of the four pixels is provided with light sources of three colors, and each of the light sources of three colors includes a light emitting diode element.

19. A surface mount device used in a display device, the surface mount device comprising:
four pixels;
a first terminal, a second terminal, and a third terminal connected to different signal lines, respectively; and
a fourth terminal, a fifth terminal, a sixth terminal, and a seventh terminal connected to different scanning lines, respectively, wherein
each of the four pixels is provided with light sources of two colors, and each of the light sources of two colors includes a light emitting diode element.

20. A surface mount device used in a display device, the surface mount device comprising:
four pixels;
a first terminal, a second terminal, and a third terminal connected to different signal lines, respectively; and
a fourth terminal, a fifth terminal, and a sixth terminal connected to different scanning lines, respectively, wherein
each of the four pixels is provided with light sources of two colors, and each of the light sources of two colors includes a light emitting diode element.

* * * * *